(12) United States Patent
Lee

(10) Patent No.: US 8,305,813 B2
(45) Date of Patent: Nov. 6, 2012

(54) NONVOLATILE MEMORY DEVICE AND METHOD OF OPERATING THE SAME

(75) Inventor: Min Kyu Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 624 days.

(21) Appl. No.: 12/493,433

(22) Filed: Jun. 29, 2009

(65) Prior Publication Data

US 2010/0182841 A1 Jul. 22, 2010

(30) Foreign Application Priority Data

Jan. 21, 2009 (KR) .................. 10-2009-0005085

(51) Int. Cl.
*G11C 16/06* (2006.01)

(52) U.S. Cl. ......... 365/185.21; 365/185.22; 365/185.25; 365/203

(58) Field of Classification Search ............. 365/189.05, 365/185.12, 185.21, 185.22, 185.25, 235, 365/203

See application file for complete search history.

(56) References Cited

U.S. PATENT DOCUMENTS

| 7,333,365 B2 * | 2/2008 | Seong ................. 365/185.12 |
| 7,505,322 B2 * | 3/2009 | Lee ..................... 365/185.17 |
| 7,724,575 B2 * | 5/2010 | Lee et al. ............. 365/185.12 |
| 2006/0215453 A1 * | 9/2006 | Seong ................. 365/185.12 |
| 2007/0028155 A1 * | 2/2007 | Kim et al. .................. 714/755 |
| 2007/0058446 A1 * | 3/2007 | Hwang et al. ......... 365/185.29 |
| 2008/0158971 A1 * | 7/2008 | Lee ..................... 365/185.17 |

FOREIGN PATENT DOCUMENTS

KR 100648286 11/2006
KR 1020080090841 10/2008

OTHER PUBLICATIONS

Notice of Preliminary Rejection issued from Korean Intellectual Property Office on Jul. 22, 2010.

* cited by examiner

*Primary Examiner* — Toan Le
(74) *Attorney, Agent, or Firm* — IP & T Group LLP

(57) ABSTRACT

A nonvolatile memory device includes a data latch unit configured to store data to be programmed into a memory cell or store data read from a memory cell, and page buffers each comprising a sense node discharge unit configured to selectively ground a sense node depending on data stored in the data latch unit and in response to a sense node discharge signal.

33 Claims, 11 Drawing Sheets

| Classification | A | B | C | D |
|---|---|---|---|---|
| State | Erase state | Vt < PV1' | PV1'<Vt<PV1 | Vt > PV1 |
| BL | 0 | 0 | 1 | 1 |
| QM_N | 1 | 0 | 0 | 0 |
| QT_N | 1 | 0 | 1 | 1 |

<Verify operation based on voltage PV1'>

| Classification | A | B | C | D |
|---|---|---|---|---|
| State | Erase state | Vt < PV1' | PV1'<Vt<PV1 | Vt > PV1 |
| BL | 0 | 0 | 0 | 1 |
| QM_N | 1 | 0 | 0 | 1 |
| QT_N | 1 | 0 | 1 | 1 |

<Verify operation based on voltage PV1>

NONVOLATILE MEMORY DEVICE AND METHOD OF OPERATING THE SAME

CROSS-REFERENCES TO RELATED APPLICATIONS

Priority to Korean patent application number 10-2009-0005085 filed on Jan. 21, 2009, the entire disclosure of which is incorporated by reference herein, is claimed.

BACKGROUND

One or more embodiments relate to a nonvolatile memory device and a method of operating the same.

Recently, there is an increasing demand for nonvolatile memory devices which can be electrically programmed and erased and do not require the refresh function of rewriting data at specific intervals.

A nonvolatile memory cell enables an electrical program/erase operation and performs the program and erase operations through threshold voltages varying when electrons are migrated by a strong electric field applied to a thin oxide layer.

When the program operation of this nonvolatile memory device is performed, the threshold voltages of cells do not have the same value, but are distributed with some degree of variation. With wide distributions of the threshold voltages, read margin is narrowed, thereby deteriorating the property of the nonvolatile memory device. In particular, in the case where there exist three or more different distributions as in a Multi-Level Cell (MLC) program method, it is more preferred that the distribution in each state is limited to a narrow range. However, as the size of each cell shrinks with the high integration of a memory device, abnormal phenomena is generated, so the distribution becomes wider.

All the distributions of threshold voltages of a nonvolatile memory device using a known Incremental Step Pulse Program (ISPP) method are determined by various factors, such as an under program phenomenon, the step voltage of ISPP, floating gate interference, bit line coupling noise, and abnormal phenomena.

In particular, one or more embodiments are directed to solving an under program phenomenon generated by the source line bouncing phenomenon, the increase in the distributions of threshold voltages resulting from bit line coupling noise, and so on.

BRIEF SUMMARY

One or more embodiments are directed towards a nonvolatile memory device and a method of operating the same, wherein a verification operation is not performed on cells except for a cell to be programmed in order to solve the problems, such as the source line bouncing phenomenon and bit line coupling noise.

One or more embodiments are directed to a nonvolatile memory device includes a data latch unit configured to store data to be programmed into a memory cell or store data read from a memory cell, and page buffers each comprising a sense node discharge unit configured to selectively ground a sense node depending on data stored in the data latch unit and in response to a sense node discharge signal.

One or more embodiments are directed to a nonvolatile memory device, including a first register configured to store data to be programmed into a memory cell or store data read from a memory cell, and page buffers each comprising a first sense node discharge unit configured to selectively ground a sense node depending on data stored in the first register and in response to a first sense node discharge signal.

One or more embodiments are directed to a method of operating a nonvolatile memory device comprising page buffers each comprising a sense node discharge unit configured to selectively ground a sense node depending on data stored in the page buffer and in response to a sense node discharge signal, the method including, performing a program operation depending on the data stored in the page buffer, selectively precharging a sense node, selectively precharging a bit line connecting the sense node and the bit line, changing a voltage level of the bit line depending on a state of a cell, sensing the voltage level of the bit line and storing the sensed voltage level of the bit line in the page buffer, and performing a verification operation whether the program operation has been completed based on the stored data.

One or more embodiments are directed to a method of operating a nonvolatile memory device comprising a number of registers and page buffers, wherein each of the page buffers comprises a number of sense node discharge units configured to selectively ground a sense node depending on data stored in the respective registers and in response to a sense node discharge signal, the method including performing a program operation depending on the data stored in the page buffer, selectively precharging the sense node depending on data stored in a first register of the page buffer, selectively precharging a bit line connecting the sense node and the bit line, storing a program completion data in the first register when a cell is programmed to a first preliminary voltage or more by performing a verification operation, performing a program operation depending on data stored in the page buffer when all cells to be programmed have been programmed to have the first preliminary voltage or more, selectively precharging the sense node depending on data stored in a second register of the page buffer, storing program completion data in the second register when a cell is programmed to a first reference voltage or more by performing a verification operation, and terminating the program operation.

One or more embodiments are directed to a method of operating a nonvolatile memory device comprising page buffers each comprising a sense node discharge unit configured to selectively ground a sense node depending on data stored in the page buffer and in response to a sense node discharge signal, the method including, performing a program operation depending on the data stored in the page buffer, selectively performing a verification operation depending on a stored data to be programmed, and repeating the program and the verification operation until cells to be programmed are programmed to have a reference voltage or more.

One or more embodiments are directed to a nonvolatile memory device comprising page buffers, wherein each of the page buffers includes a data latch unit configured to store data to be programmed into a memory cell or to store data read from a memory cell, and a sense node voltage setting unit configured to ground a sense node or supply a power supply voltage to the sense node depending on the data stored in the data latch unit.

DESCRIPTION OF SPECIFIC EMBODIMENT

Hereinafter, the present disclosure will be described in detail in connection with one or more embodiments with reference to the accompanying drawings. The figures are provided to allow those having ordinary skill in the art to understand the scope of one or more embodiments of the disclosure.

Figure 1:
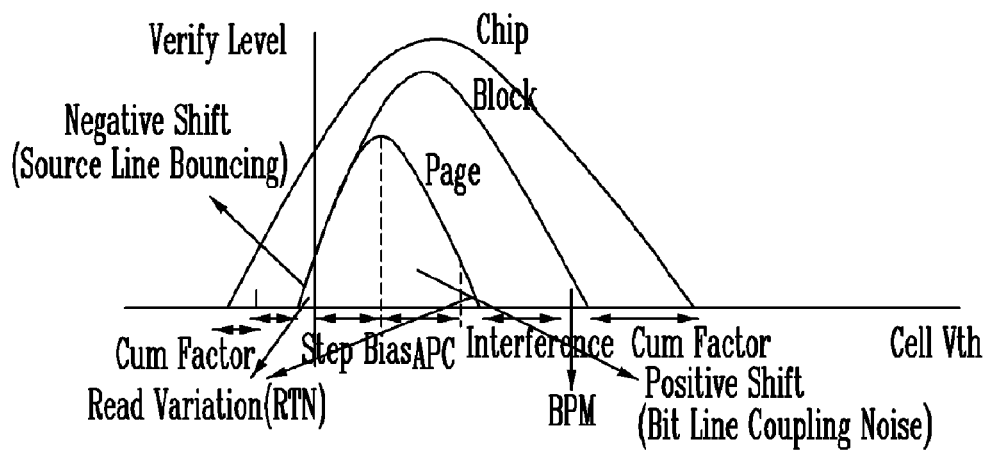
FIG. 1 is a graph showing the analysis results of the distributions of cells in the program operation of a known nonvolatile memory device.

FIG. 1 is a graph showing the analysis results of the distributions of cells in a program operation by a known nonvolatile memory device.

When the program operation of a nonvolatile memory device is performed, the threshold voltages of cells do not have the same value, but are distributed with some degree of variation. With the distributions becoming wide, read margin is narrowed, thereby deteriorating the property of the nonvolatile memory device. In particular, in the case where there exist three or more different distributions as in an MLC program method, it is more preferred that the distribution in each state is narrow. However, as the size of each cell shrinks with the high integration of a memory device, abnormal phenomena are generated, so the distribution becomes wider.

Distributions of threshold voltages of a nonvolatile memory device using a known ISPP method are determined by various factors, such as an under program phenomenon, the step voltage of ISPP, floating gate interference, bit line coupling noise, and abnormal phenomena.

From among all the distributions, the distribution of cells on a page-by-page basis, placed on the left tail in FIG. 1, is chiefly generated by the under program phenomenon. The distribution of the cells is also caused by the source line bouncing phenomenon. Furthermore, the distribution of cells on a page-by-page basis, placed on the right tail in FIG. 1, is chiefly generated by bit line coupling noise. The states of cells to be programmed are influenced by bit line coupling noise and the states of neighbor bit lines.

The step voltage is a factor that determines the program performance. When the step voltage is low, distributions are narrow. However, there is a problem in that the time that it takes to perform a program operation is increased. Distributions by abnormal phenomena result from the trap and release of electric charges owing to a reduction in the cell size. It is difficult to remove the trap and release of charges. One or more embodiments are contrived to minimize the source line bouncing phenomenon and the bit line coupling noise in order to minimize the distribution placed on the left tail.

Figure 2A:
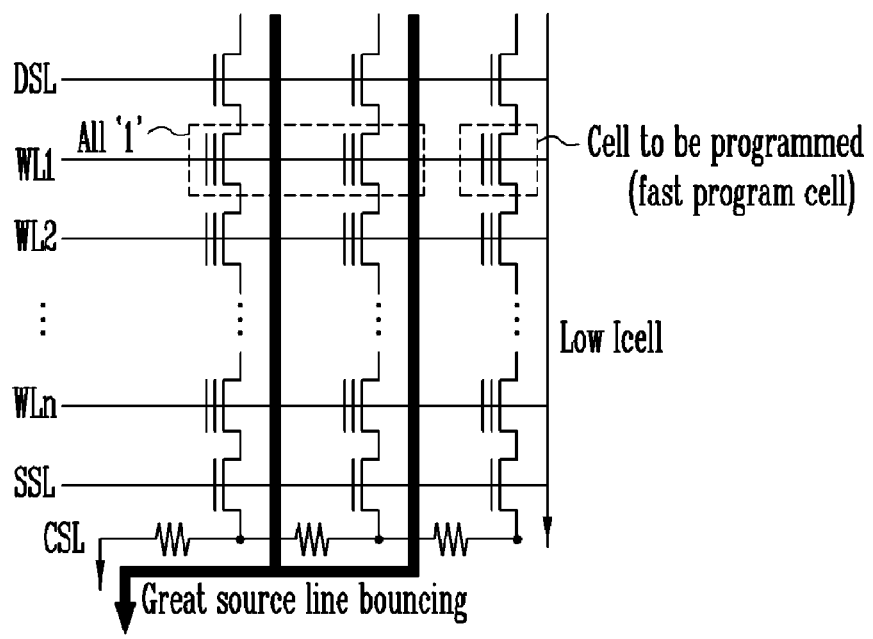
FIGS. 2A and 2B are diagrams showing a source line bouncing phenomenon occurring because of the resistance component of a source line.
Figure 2B:
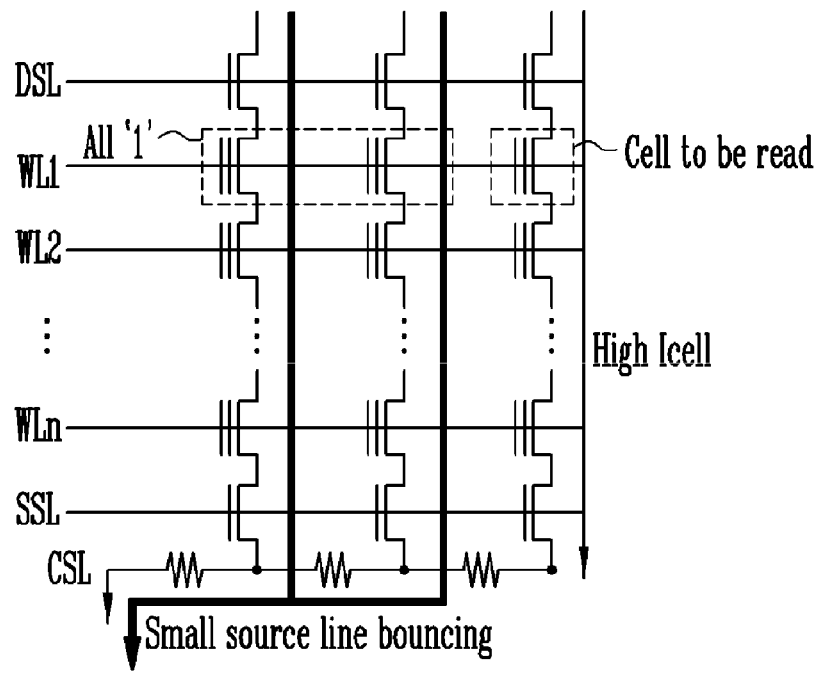

FIGS. 2A and 2B are diagrams showing a source line bouncing phenomenon occurring because of the resistance component of a source line.

The structure of a memory cell array is first described. The memory cell array includes groups of memory cells configured to store data, groups of word lines WL0, WL1, . . . , WLn configured to select and enable the memory cells, and groups of bit lines BL0, BL1, . . . , BLm configured to input or output the data of the memory cells. The memory cell array has a structure in which the groups of word lines and the groups of bit lines are arranged in matrix form. Each of the groups of memory cells has a string structure and is connected in series between a source select transistor SSL and a drain select transistor DSL. The gates of the memory cells are connected to the respective word lines, and the memory cells in common connected to the same word line is called a page. The strings connected to the respective bit lines are connected in parallel to a common source line CSL, thus constituting a block.

Meanwhile, the strings are connected to the common source line CSL. The common source line CSL (i.e., an n+ diffused source line) includes a resistance component. Noise is generated because of a high resistance of the source line, thereby affecting the control of threshold voltages.

It is assumed that, in this drawing, a page connected to a selected word line is programmed. In FIG. 2A, the page includes not only a cell that is first programmed (i.e., a fast program cell), but also slow program cells, which are the subject of program in the same word line, but are not programmed.

In accordance to a known verification operation, in the state where the bit line is precharged to a high level, whether or not a program operation has been completed is determined based on whether the voltage level of the bit line has been changed depending on the state of a cell. That is, if, as a result of the determination, the program operation has been completed, the bit line remains in the high level. If, as a result of the determination, the program operation has not been completed, the voltage of the bit line is discharged through the common source line. Slow program cells (indicated by "1") are discharged from a precharge level to a ground voltage because they have not yet been programmed. Here, both the voltage of the common source line and the source voltage of the fast program cell rise because of the resistance of the common source line. Consequently, the sensing current Icell of the fast program cell decreases because of the noise of the common source line.

Fast program cells are determined to be successfully verified because of the decreased current even through the threshold voltages of the fast program cells are lower than a verify voltage. No further program is performed on the fast program cells because the cells are determined to have been programmed.

FIG. 2B shows a state where all the slow program cells have been programmed, so the noise of the common source line has decreased. If a read operation is performed in this state, the bouncing phenomenon disappears because the noise of the common source line decreases, and current flowing through the fast program cells rises as compared with the verification operation. Consequently, the read voltage of each of the fast program cells is read as being lower the threshold voltage of the fast program cell.

As described above, the bouncing phenomenon in which the voltage level of the source line shifts depending on the program states of neighbor cells is generated, and the levels of current flowing through specific cells differently change. Accordingly, cells which are determined to have been programmed despite not being programmed (i.e., under-programmed cells) occur.

Figure 3:
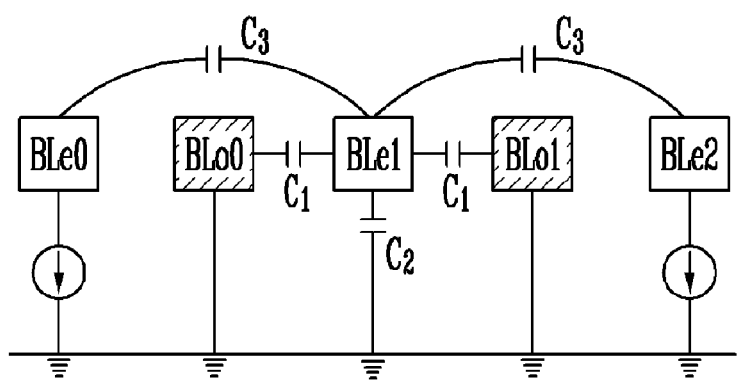
FIG. 3 is a diagram showing the occurrence of bit line coupling noise.

FIG. 3 is a diagram showing the occurrence of bit line coupling noise.

As the capacity of a memory device integrated in a nonvolatile memory device increases, coupling noise between bit lines becomes problematic. In the case where a bit line BL2 adjacent to the bit line BL1 of an off-cell is connected to an on-cell, when a read operation for the neighbor bit line BL2 is performed, voltage shifts from a precharge level to 0 V, and the voltage of the bit line BL1 of the off-cell also drops because of coupling between the bit lines.

With the increasing memory capacity, the pitch between the bit lines decreases, which increases the coupling coefficient to 80% or more. Accordingly, in the case where an off-cell is placed between on-cells, the bit line voltage of the off-cell drops up to 20% of the precharge level. It means that the amount in the shift of the bit line voltage has to be set to be higher than 80% of the precharge level. As a method of inhibiting a voltage drop resulting from this bit line coupling, the construction, such as that shown in FIG. 3, is known. That is, all bit lines are divided into even bit lines BLe (i.e., the group of even-numbered bit lines) and odd bit lines BLo (i.e., the group of odd-numbered bit lines), and program, verify, and read operations are performed on each of the even bit lines BLe and the odd bit lines BLo independently. For example, if a read operation is performed on cells connected to the even bit line BLe, the odd bit line BLo is grounded and is used as a shielding line. Accordingly, coupling noise between the even bit line and the odd bit line can be removed. However, coupling noise between the even bit lines and coupling noise between the odd bit lines increase because of a reduction in the size of a memory cell. Furthermore, as the number of memory cells included in one page increases, there is a high probability that the bit line coupling noise may happen. On the other hand, the increase in the number of memory cells included in a page results in an increased cell current when a read operation is performed. Accordingly, the source line bouncing can be increased.

Figure 4:
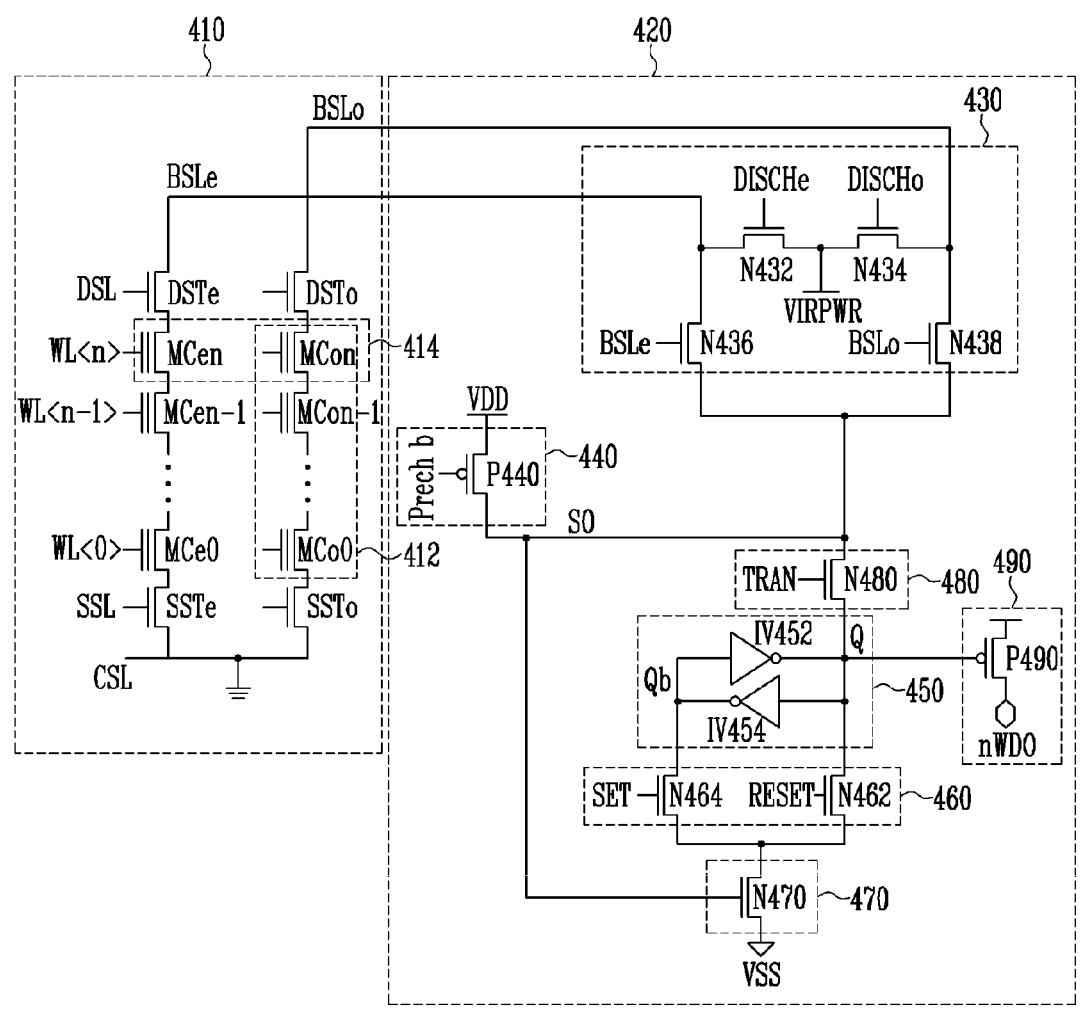
FIG. 4 is a circuit diagram showing the configuration of a known nonvolatile memory device.

FIG. 4 is a circuit diagram showing the configuration of a known nonvolatile memory device.

The nonvolatile memory device 400 includes a memory cell array 410 and a page buffer 420. The memory cell array 410 includes a number of memory cells. The page buffer 420 is connected to the memory cells and is configured to program specific data into the memory cells or read data stored in the memory cells.

The memory cell array 410 includes memory cells MC0 to MCn configured to store data, word lines WL<0:n> configured to select and enable the memory cells, and bit lines BLe and BLo configured to input or output data to or from the memory cells. The memory cell array 410 has a structure in which the word lines and the bit lines are arranged in matrix form.

The memory cell array 410 includes drain select transistors DSTe and DSTo connected between the bit lines and the memory cells and source select transistors SSTe and SSTo connected between a common source line CSL and the memory cells. A group of the memory cells, connected in series between the source select transistors SSTe and SSTo and the drain select transistors DSTe and DSTo, is called a cell string 412.

The gates of the memory cells are connected to the word lines. A set of the memory cells in common connected to the same word line is called a page 414. A number of the strings connected to the respective bit lines are connected in parallel to the common source line, thus constituting a block.

The page buffer 420 includes a bit line select unit 430 configured to selectively connect a bit line, connected to specific memory cells, to a sense node SO, a sense node precharge unit 440 configured to apply the power supply voltage of a high level to the sense node, a data latch unit 450 configured to temporarily store data to be programmed into specific cells or to temporarily store data read from specific cells, a data setting unit 460 configured to input data to be stored in the data latch unit, a sense node sensing unit 470 configured to apply a ground voltage to a specific node of the data latch unit depending on the level of the sense node, a data transmission unit 480 configured to apply data, stored in the data latch unit, to the sense node, and a verification signal output unit 490 configured to inform whether verification has been completed based on data stored in the data latch unit 450.

The bit line select unit 430 includes an NMOS transistor N436 configured to connect the even bit line BLe and the sense node SO in response to a first bit line select signal BSLe and an NMOS transistor N438 configured to connect the odd bit line BLo and the sense node SO in response to a second bit line select signal BSLo. Furthermore, the bit line select unit 430 further includes a variable voltage input terminal configured to apply a variable voltage VIRPWR of a specific level, an NMOS transistor N432 configured to connect the even bit line BLe and the variable voltage input terminal in response to a first discharge signal DISCHe, and an NMOS transistor N434 configured to connect the odd bit line BLo and the variable voltage input terminal in response to a second discharge signal DISCHo.

The sense node precharge unit 440 applies a power supply voltage VDD of a high level to the sense node SO in response to a precharge signal Prech b. To this end, the sense node precharge unit 440 includes a PMOS transistor P440 connected between the power source terminal VDD and the sense node SO. Accordingly, the sense node precharge unit 440 can apply the power supply voltage of a high level to the sense node SO in response to the precharge signal of a low level.

The data latch unit 450 temporarily stores data to be programmed into specific cells or temporarily stores data read from specific cells. To this end, the output terminal of a first inverter IV452 is connected to the input terminal of a second inverter IV454, and the output terminal of the second inverter IV454 is connected to the input terminal of the first inverter IV452. Here, a node between the output terminal of the first inverter IV452 and the input terminal of the second inverter IV454 is called a first node Q, and a node between the output terminal of the second inverter IV454 and the input terminal of the first inverter IV452 is called a second node Qb.

The data setting unit 460 includes a first data setting transistor N462 configured to apply the ground voltage to the first node Q of the data latch unit 450 and a second data setting transistor N464 configured to apply the ground voltage to the second node Qb. The first data setting transistor N462 is connected between the sense node sensing unit 470 and the first node Q and is configured to apply the ground voltage, transferred by the sense node sensing unit 470, to the first node Q in response to a first data setting signal RESET. Furthermore, the second data setting transistor N464 is connected between the sense node sensing unit 470 and the second node Qb and is configured to apply the ground voltage, transferred by the sense node sensing unit 470, to the second node Qb in response to a second data setting signal SET.

The sense node sensing unit 470 applies the ground voltage to the data setting unit 460 depending on the voltage level of the sense node SO. To this end, the sense node sensing unit 470 includes an NMOS transistor N470 connected between the data setting unit 460 and a ground terminal VSS. Accordingly, the sense node sensing unit 470 applies the ground voltage to the data setting unit 460 depending on the voltage level of the sense node SO. Only when the voltage level of the sense node is a high level, the sense node sensing unit 470 applies the ground voltage to the data setting unit 460. When the first data setting signal RESET of a high level is applied, the ground voltage is applied to the first node Q. In this case, it is determined that low-level data has been applied to the first node Q. When the second data setting signal SET of a high level is applied, however, the ground voltage is applied to the second node Qb. In this case, it is determined that high-level data has been applied to the first node Q.

The data transmission unit 480 selectively applies data, stored in the first node Q of the data latch unit 450, to the sense node SO. To this end, the data transmission unit 480 includes a data transmission transistor N480 configured to selectively connect the first node Q and the sense node SO in response to a data transmission signal TRAN.

The verification signal output unit 490 outputs a signal, indicating whether or not verification has been completed, depending on data stored in the first node Q of the data latch unit 450. To this end, the verification signal output unit 490 includes a PMOS transistor P490 configured to transfer the power supply voltage of a high level to a verification signal output terminal nWDO in response to the signal of the first node Q. Alternatively, the verification signal output unit 490 may include an NMOS transistor configured to transfer the power supply voltage of a high level to the verification signal output terminal nWDO in response to the signal of the second node Qb.

Meanwhile, although not shown in the drawings, an additional switching element, functioning as the NMOS transistors N436 and N438 of the bit line select unit 430, may be included. In other words, an NMOS transistor configured to turn on in response to a bit line sense signal PBSENSE may be connected between the bit line select unit 430 and the sense node SO in order to replace the roles of the NMOS transistors N436 and N438.

Figure 5:
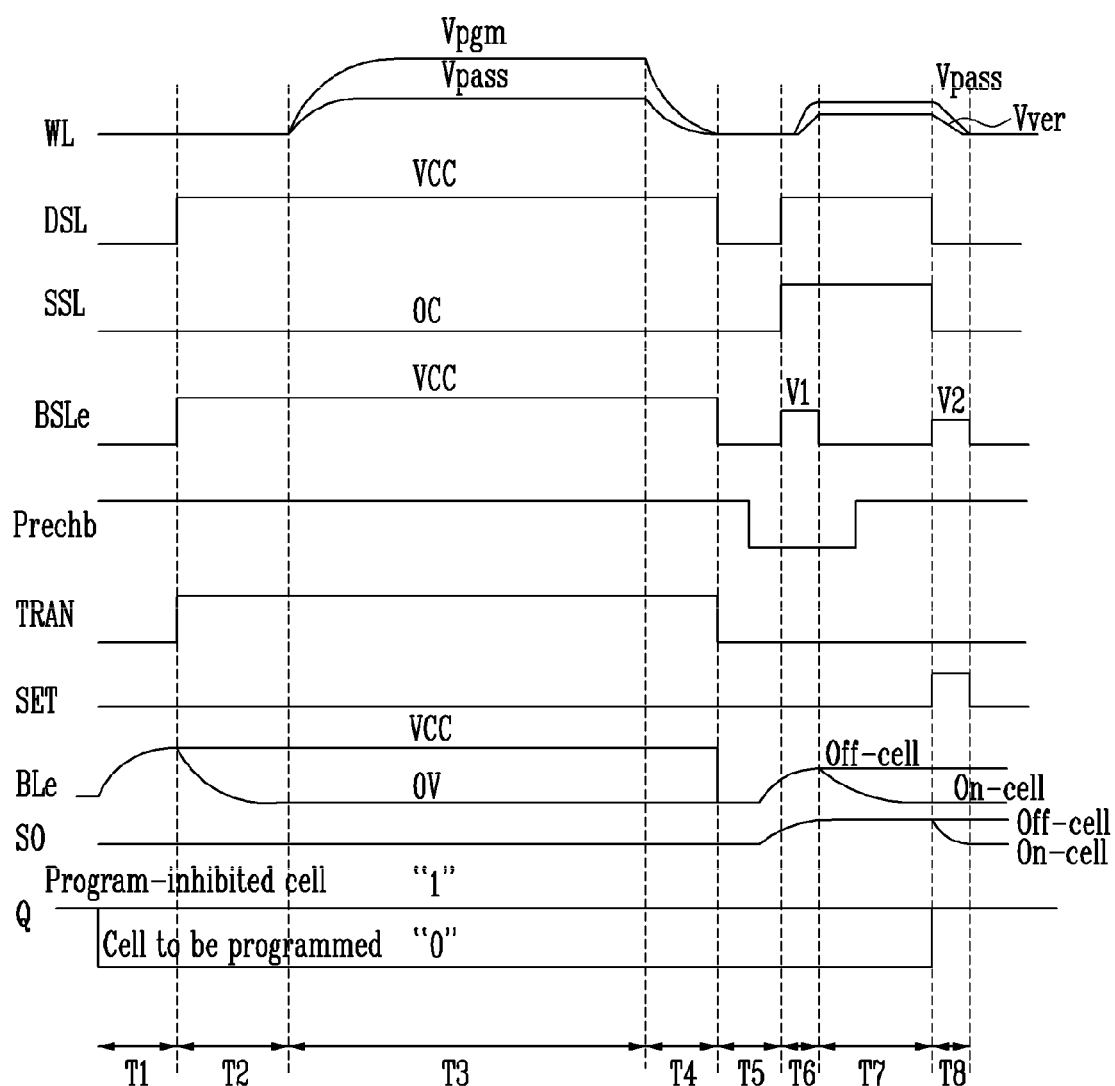
FIG. 5 is a waveform showing various control signals applied when the known program and verification operations of the nonvolatile memory device are performed.

FIG. 5 is a waveform showing various control signals applied when the known program and verification operations of the nonvolatile memory device are performed.

(1) Program Operation

First, in the state where the power supply voltage is being applied to the variable voltage input terminal VIRPWR, the NMOS transistor N432 or N434 is turned on, thereby precharging a bit line to a high level (period T1). In FIG. 5, the even bit lines are first precharged. Cells connected to the even bit lines (i.e., cells included in even pages) become the subject of program, and whether the cells will be programmed is determined depending on data stored in the first node Q of the data latch unit 450. Typically, when data '0' is stored in the first node Q, cells become the subject of program and, when data '1' is stored in the first node Q, cells become the subject of program prohibition.

Next, the data transmission signal TRAN of a high level, the bit line select signal BSL, and the drain select signal DSL are input, so that the data of the first node Q is transferred to the bit line (period T2). Consequently, the voltage level of the bit line is changed depending on the data stored in the first node Q. That is, when data '0' is stored in the first node Q, the voltage level of the bit line shifts to a low level and, when data '1' is stored in the first node Q, the voltage level of the bit line remains in the high level.

Next, a program voltage (Vpgm) is applied to a selected word line, and a pass voltage (Vpass) is applied to unselected word lines (period T3). For example, in FIG. 4, in the case where a program operation will be performed on cells connected to the first word line WL<0>, the program voltage (Vpgm) is applied to only the corresponding word line WL<0>, and the pass voltage (Vpass) is applied to the remaining word lines. Consequently, the threshold voltage of a cell in which the voltage level of the bit line (the channel voltage of a memory cell) has shifted to a low level, which belongs to the cells connected to the selected word line, rise because of the FN tunneling effect.

The application of the program voltage (Vpgm) and the pass voltage (Vpass) is stopped, and the program operation is stopped (period T4).

(2) Verification Operation

After the program operation has been performed, it is determined whether the threshold voltages of cells to be programmed have risen to a reference voltage. In particular, in the case of an ISPP method, it is determined whether a program pulse will be further applied by performing a verification operation after each program pulse is applied.

First, in the state where the sense node and the bit line are disconnected, the sense node is precharged to a high level and the bit line are discharged to a low level (T5). That is, the sense node SO is precharged to a high level by applying the sense node precharge signal Prech b of a low level. The variable voltage input terminal VIRPWR being in a ground state is connected to the bit line so that the bit line is discharged.

Next, the bit line is precharged to a high level (V1-Vt) by applying the bit line select signal BSL of a first voltage V1 (period T6). At this time, the drain select signal DSL and the source select signal SSL are applied so that a current path is formed between the bit line and the common source line.

Next, the application of the bit line select signal BSL is stopped and the connection between the sense node and the bit line is terminated so that the voltage level of the bit line is changed depending on the threshold voltages of the cells to be verified (period T7). Here, a reference voltage (Vver) is applied to the word line of the cells to be verified, and the pass voltage (Vpass) is applied to the word line of the remaining cells. Accordingly, the remaining cells are all in a turned-on state.

If the threshold voltages of the cells to be verified have risen to the reference voltage or more because of the program operation, the corresponding cells are not turned on. Accordingly, a current path is not formed between the bit line and the common source line, so the bit line remains in the precharged level. If the threshold voltages of the cells to be verified are lower than the reference voltage despite the program operation, the corresponding cells are turned on. Accordingly, a current path is not formed between the bit line and the common source line, so the voltage level of the bit line is discharged to a low level.

On the other hand, for the operation of a next period T8, the application of the precharge signal Prech b is stopped, thereby making the sense node SO in a floating state.

Next, the voltage level of the bit line is selected by applying the bit line select signal BSL of a second voltage V2 (period T8).

When the threshold voltages of the cells to be verified are lower than the reference voltage and therefore the voltage level of the bit line is lower than the second voltage V2, the sense node and the bit line are connected to each other because the NMOS transistor N436 or N438 is turned on by the application of the second voltage V2. Accordingly, the voltage level of the sense node SO is also discharged to a low level.

On the contrary, if the threshold voltages of the cells to be verified are higher than the reference voltage and therefore the voltage level of the bit line remains in the high level, the sense node and the bit line are not connected because the NMOS transistor N436 or N438 is turned off by the application of the second voltage V2. Accordingly, the voltage level of the sense node SO of a floating state remains intact.

Accordingly, whether to operate the sense node sensing unit 470 is determined. That is, only when the threshold voltages of the cells to be verified are higher than the reference voltage, the sense node SO remains in the high level and the sense node sensing unit 470 operates. Here, if the second data setting signal SET is applied, the ground voltage is applied to the second node Qb, so data '1' is stored in the first node Q. In the case of program-inhibited cells, data '1' is initially stored in the cells. Accordingly, if it is determined that data '1' has been stored in the first nodes Q of all page buffers, it is determined that a verification operation has been completed.

In the verification operation of the nonvolatile memory device, all the bit lines are precharged to a high level and the verification operation is then performed. In the construction in which the even bit lines and the odd bit lines are separately operated, pages are divided into even pages, including cells connected to the even bit lines, and odd pages, including cells connected to the odd bit lines, and a verification operation is performed on each of the even pages and the odd pages. A read operation is also performed in accordance with almost the same principle as the verification operation. In this method, however, unwanted current flows through the bit lines because bit lines connected to cells on which a verification operation needs not to be performed, such as program-inhibited cells, are precharged and are then discharged after verification. Moreover, coupling noise between the bit lines becomes worse. According to one or more embodiments, in order to reduce the source line bouncing and the bit line coupling noise, bit lines are selectively precharged depending on external data.

Figure 6:
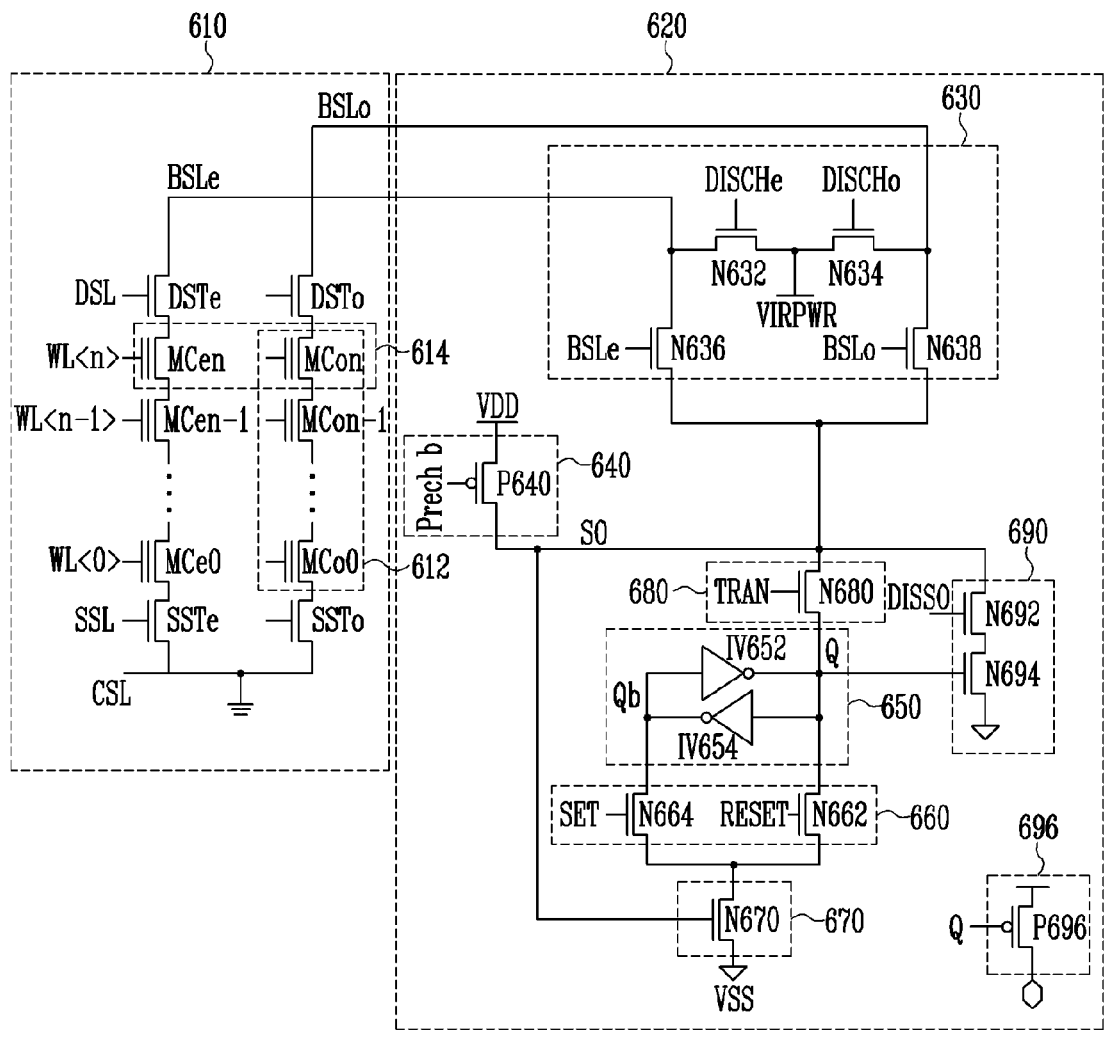
FIG. 6 is a circuit diagram of a nonvolatile memory device according to an embodiment.
Figure 6:
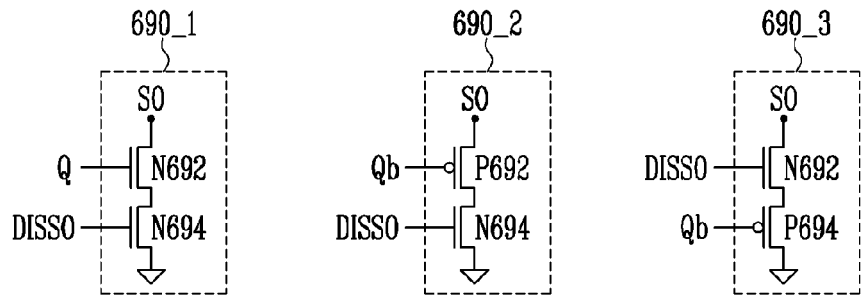

FIG. 6 is a circuit diagram of a nonvolatile memory device according to an embodiment.

The nonvolatile memory device 600 includes a memory cell array 610, including memory cells, and a page buffer 620 connected to the memory cells and configured to program specific data into the memory cells or read data stored in the memory cells.

For a detailed description of the memory cell array 610, reference can be made to the description of FIG. 4.

The page buffer 620 includes a bit line select unit 630 configured to selectively connect a bit line, connected to specific memory cells, to a sense node SO, a sense node precharge unit 640 configured to apply the power supply voltage of a high level to the sense node, a data latch unit 650 configured to temporarily store data to be programmed into specific cells or to temporarily store data read from specific cells, a data setting unit 660 configured to input data to be stored in the data latch unit, a sense node sensing unit 670 configured to apply a ground voltage to a specific node of the data latch unit depending on the level of the sense node, a data transmission unit 680 configured to apply data, stored in the data latch unit, to the sense node, and a verification signal output unit 690 configured to inform whether verification has been completed based on data stored in the data latch unit 650. The page buffer 620 further includes a sense node discharge unit 690 configured to selectively ground the sense node SO depending on data stored in the data latch unit 650 and in response to a sense node discharge signal DISSO.

The bit line select unit 630 includes an NMOS transistor N636 configured to connect the even bit line BLe and the sense node SO in response to a first bit line select signal BSLe and an NMOS transistor N638 configured to connect the odd bit line BLo and the sense node SO in response to a second bit line select signal BSLo. Furthermore, the bit line select unit 630 further includes a variable voltage input terminal configured to apply a variable voltage VIRPWR of a specific level, an NMOS transistor N632 configured to connect the even bit line BLe and the variable voltage input terminal in response to a first discharge signal DISCHe, and an NMOS transistor N634 configured to connect the odd bit line BLo and the variable voltage input terminal in response to a second discharge signal DISCHo.

The sense node precharge unit 640 applies a power supply voltage VDD of a high level to the sense node SO in response to a precharge signal Prech b. To this end, the sense node precharge unit 640 includes a PMOS transistor P640 connected between the power source terminal VDD and the sense node SO. Accordingly, the sense node precharge unit 640 can apply the power supply voltage of a high level to the sense node SO in response to the precharge signal of a low level.

The data latch unit 650 temporarily stores data to be programmed into specific cells or temporarily stores data read from specific cells. To this end, the output terminal of a first inverter IV652 is connected to the input terminal of a second inverter IV654, and the output terminal of the second inverter IV654 is connected to the input terminal of the first inverter IV652. Here, a node between the output terminal of the first inverter IV652 and the input terminal of the second inverter IV654 is called a first node Q, and a node between the output terminal of the second inverter IV654 and the input terminal of the first inverter IV652 is called a second node Qb.

The data setting unit 660 includes a first data setting transistor N662 configured to apply the ground voltage to the first node Q of the data latch unit 650 and a second data setting transistor N664 configured to apply the ground voltage to the second node Qb. The first data setting transistor N662 is connected between the sense node sensing unit 670 and the first node Q and is configured to apply the ground voltage, transferred by the sense node sensing unit 670, to the first node Q in response to a first data setting signal RESET. Furthermore, the second data setting transistor N664 is connected between the sense node sensing unit 670 and the second node Qb and is configured to apply the ground voltage, transferred by the sense node sensing unit 670, to the second node Qb in response to a second data setting signal SET.

The sense node sensing unit 670 applies the ground voltage to the data setting unit 660 depending on the voltage level of the sense node SO. To this end, the sense node sensing unit 670 includes an NMOS transistor N670 connected between the data setting unit 660 and a ground terminal VSS. Accordingly, the sense node sensing unit 670 applies the ground voltage to the data setting unit 660 depending on the voltage level of the sense node SO. Only when the voltage level of the sense node is a high level, the sense node sensing unit 670 applies the ground voltage to the data setting unit 660. When the first data setting signal RESET of a high level is applied, the ground voltage is applied to the first node Q. In this case, it is determined that low-level data has been applied to the first node Q. When the second data setting signal SET of a high level is applied, however, the ground voltage is applied to the second node Qb. In this case, it is determined that high-level data has been applied to the first node Q.

The data transmission unit 680 selectively applies data, stored in the first node Q of the data latch unit 650, to the sense node SO. To this end, the data transmission unit 680 includes a data transmission transistor N680 configured to selectively connect the first node Q and the sense node SO in response to a data transmission signal TRAN.

The sense node discharge unit 690 selectively grounds the sense node SO depending on data stored in the data latch unit 650 and in response to the sense node discharge signal DISSO. According to one or more embodiments, when data, informing that program has been completed, or program-inhibited data is stored in the data latch unit 650 and when the sense node discharge signal DISSO is applied, the sense node is grounded.

To this end, the sense node discharge unit 690 includes a first switching element N692 and a second switching element N694 connected in series between the sense node SO and a ground terminal. The sense node discharge signal DISSO is applied to the gate of the first switching element N692. The first switching element N692 is connected between the sense node SO and the second switching element N694. Data stored in the first node Q of the data latch unit 650 is applied to the gate of the second switching element N694. The second switching element N694 is connected between the ground terminal and the first switching element N692.

Alternatively, a switching element N692 turned on by the first node Q may be connected to the sense node SO, and a switching element N694 turned on in response to the sense node discharge signal DISSO may be connected to the ground terminal (690_1).

Alternatively, a PMOS transistor P692 turned on by the second node Qb may be connected to the sense node SO, and a switching element N694 turned on in response to the sense node discharge signal DISSO may be connected to the ground terminal (690_2).

Alternatively, a PMOS transistor P694 turned on by the second node Qb may be connected to the ground terminal and a switching element N692 turned on in response to the sense node discharge signal DISSO may be connected to the sense node SO (690_3).

For example, when data '0' (i.e., data to be programmed) is stored in the first node Q, the sense node SO is not discharged because the switching element N694 is not turned on. Furthermore, if the sense node discharge signal DISSO is not applied although data '1' (i.e., program-inhibited data) is stored in the first node Q, the sense node is not discharged.

If, in the state where data '1' (i.e., program-inhibited data) is being stored in the first node Q, the sense node discharge signal DISSO is applied, the sense node SO is discharged. In this case, a corresponding bit line is not precharged to a high level. Furthermore, when data '0' (i.e., data to be programmed) is stored in the first node Q through the first input of data and, in the state where the data stored in the first node Q changes to data '1' after the completion of programs, the sense node discharge signal DISSO is then applied, the sense node SO is discharged. In this case, a corresponding bit line is not precharged to a high level. In other words, a bit line is not precharged for not only program-inhibited cells, but also cells programmed to have a reference voltage or more while a program operation and a verification operation are repeatedly performed.

A verification signal output unit 696 outputs a signal, indicating whether or not verification has been completed, depending on data stored in the first node Q of the data latch unit 650. To this end, the verification signal output unit 696 includes a PMOS transistor P696 configured to transfer the power supply voltage of a high level to a verification signal output terminal nWDO in response to a signal of the first node Q. Alternatively, an NMOS transistor configured to transfer the power supply voltage of a high level to a verification signal output terminal nWDO in response to a signal of the first node Q may be used.

Meanwhile, although not shown in the drawing, an additional switching element, functioning as the NMOS transistors N636 and N638 of the bit line select unit 630, may be included. In other words, an NMOS transistor configured to turn on in response to a bit line sense signal PBSENSE may be connected between the bit line select unit 630 and the sense node SO in order to replace the roles of the NMOS transistors N636 and N638.

Figure 7A:
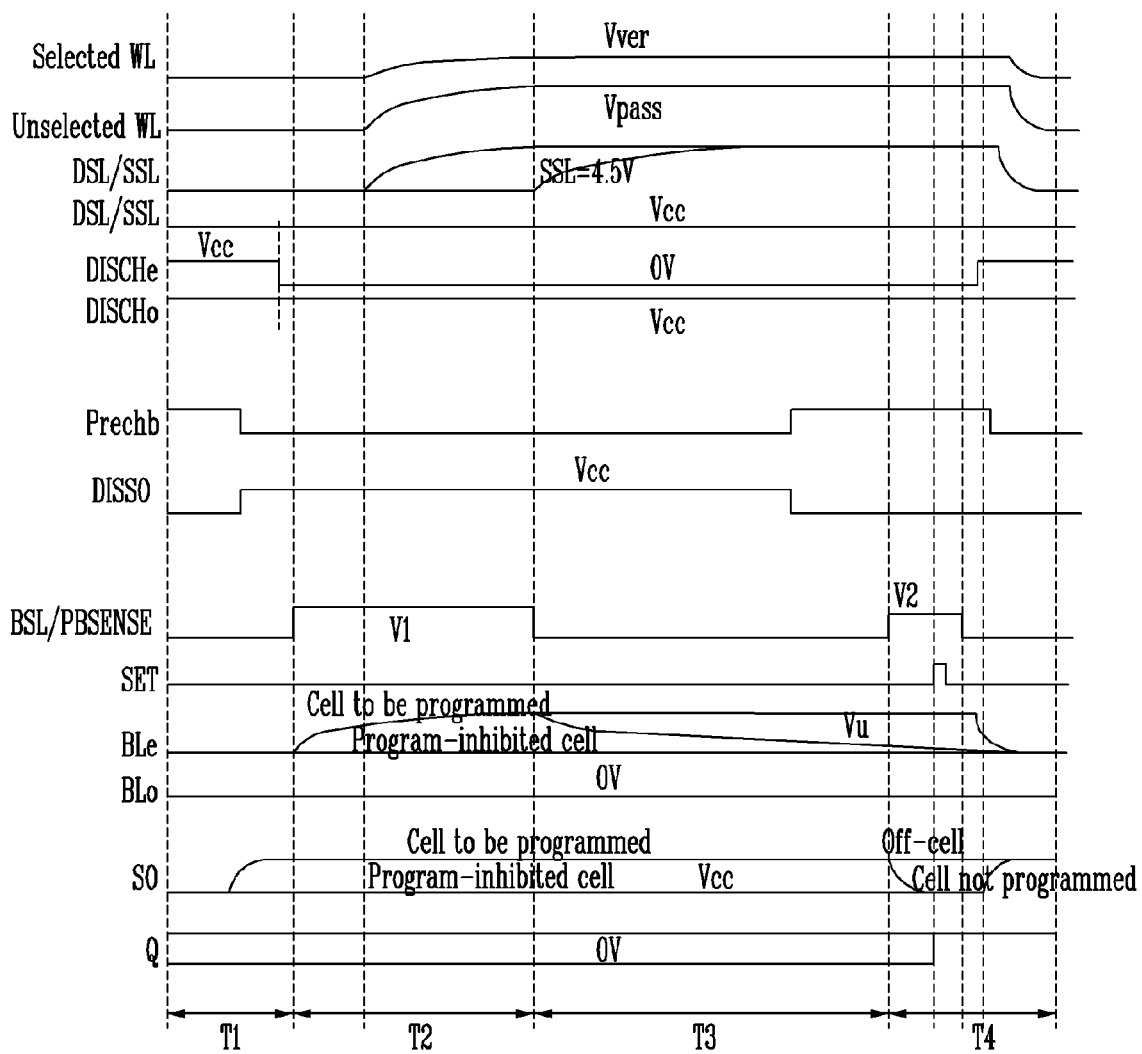
FIG. 7A is a waveform showing various control signals applied when the verification operation of the nonvolatile memory device according to an embodiment is performed.
Figure 7B:
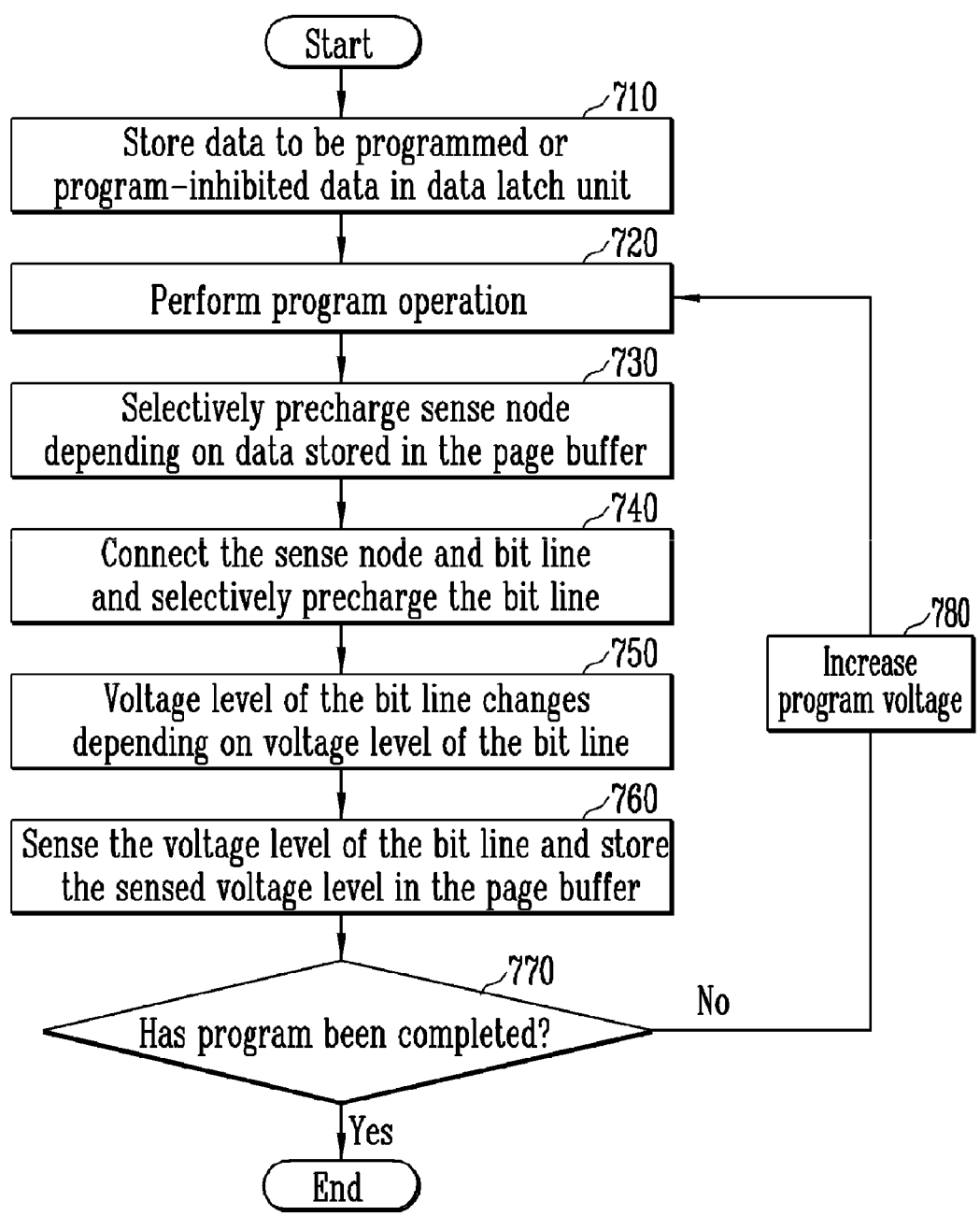
FIG. 7B is a flowchart showing the program and verification methods of the nonvolatile memory device according to an embodiment.

FIG. 7A is a waveform showing various control signals applied when the verification operation of the nonvolatile memory device according to an embodiment is performed, and FIG. 7B is a flowchart showing the program and verification methods of the nonvolatile memory device according to an embodiment.

Prior to a program operation, external data is stored in each of the page buffers at step 710. That is, data to be programmed or program-inhibited data is stored in the data latch unit 650 of the page buffer.

A program operation is performed according to the input data at step 720.

For a detailed description of the program operation, reference can be made to the description of FIG. 5.

Next, a verification operation is performed on only a cell in which the data to be programmed has been stored, but is not performed on the remaining cells. That is, the verification operation is not performed on cells programmed to have a reference voltage or more, which belong to program-inhibited cells or cells to be programmed.

To this end, the sense node is selectively precharged depending on data stored in the page buffer at step 730 (period T1).

In the state where the connection between the sense node and a bit line is terminated, the sense node is precharged to a high level, but the sense node is selectively discharged depending on data stored in the data latch unit. That is, the sense node SO is precharged to a high level by applying the sense node precharge signal Prech b of a low level. The sense node discharge signal DISSOA of a high level is then applied. Consequently, the sense node is precharged to a high level for only pages in which the data to be programmed has been stored.

In the case where data to be programmed is being stored in the data latch unit 650, the sense node discharge unit 690 is unable to supply the ground voltage to the sense node despite the sense node discharge signal DISSO. On the contrary, when data, informing the completion of a program, or program-inhibited data is stored in the data latch unit 650, the sense node discharge unit 690 supplies the ground voltage to the sense node in response to the sense node discharge signal DISSO, so the sense node remains in the ground state.

Next, the sense node is connected to the bit line so that the bit line is selectively precharged at step 740 (period T2).

The bit line is precharged a high level (V1-Vt) by applying a bit line select signal BSL of a first voltage V1 or the bit line sense signal PBSENSE. Here, the drain select signal DSL and the source select signal SSL are applied so that a current path can be formed between the bit line and the common source line.

Here, since the sense nodes of page buffers in which program-inhibited data or data indicative of the completion of program are in a ground state, the bit line also remains in the ground state.

An evaluation step of changing the voltage level of the bit line depending on the threshold voltage of a cell to be verified is then performed at step 750 (period T3).

The application of the bit line select signal BSL or the bit line sense signal PBSENSE is stopped and the connection between the sense node and the bit line is terminated, so that the voltage level of the bit line is changed depending on the threshold voltage of the cell to be verified. Here, a reference voltage (Vver) is applied to a word line connected to the cell to be verified, and a pass voltage (Vpass) is applied to word lines connected to the remaining cells. Accordingly, all the remaining cells become a turned-on state.

In the case where the threshold voltage of the cell to be verified has risen to the reference voltage by the program operation, a current path is not formed between the bit line and the common source line because the corresponding cell is not turned on, so the bit line remains in the precharged level. On the contrary, when the threshold voltage of the cell to be verified is lower than the reference voltage despite the program operation, a current path is formed between the bit line and the common source line because the corresponding cell is turned on, so the voltage level of the bit line is discharged to a low level.

Meanwhile, a bit line connected to a program-inhibited cell remains in the ground state because it has been in a discharge state in the previous operation (T2). In the prior art, the bit line connected to the program-inhibited cell is also discharged in a high-level state, thereby consuming a large amount of current. In one or more embodiments, however, there is no current consumption because the discharge state remains intact. Furthermore, a cell whose threshold voltage has risen to a reference voltage by repetitive program and verification operations (i.e., a cell that has been programmed) is also in a discharge state in the previous operation (T2). Accordingly, current consumption can be inhibited because a ground state remains intact. Consequently, the source line bouncing phenomenon and bit line coupling noise can be minimized.

Meanwhile, for the operation of a next period (T4), the application of the precharge signal Prech b and the sense node discharge signal DISSO is stopped so that the state of the sense node SO changes to a floating state.

Next, the voltage level of the bit line is sensed and the sensed voltage level is stored in the page buffer at step 760 (period T4).

The voltage level of the bit line is sensed by applying the bit line select signal BSL of the second voltage V2 or the bit line sense signal PBSENSE.

When the voltage level of the bit line is lower than a second voltage V2 because the threshold voltage of the cell to be verified is lower than the reference voltage, the NMOS transistor N636 or N638 is turned on by the application of the second voltage V2, so the sense node and the bit line are connected. Accordingly, the voltage level of the sense node SO is also discharged to a low level. On the other hand, in the case of a program-inhibited cell, the sense node SO remains in the ground state when the nonvolatile memory device is first operated.

On the contrary, when the voltage level of the bit line remains in the high level because the threshold voltage of the cell to be verified is higher than the reference voltage, the sense node and the bit line are not connected because the NMOS transistor N636 or N638 is turned off by the application of the second voltage V2. Accordingly, the voltage level of the sense node SO of a floating state remains intact.

Whether to operate the sense node sensing unit 670 is determined depending on the voltage level of the sense node SO. That is, only when the threshold voltage of a cell to be verified is higher than a reference voltage, the sense node SO remains in the high level and the sense node sensing unit 670 also operates. Here, if the second data setting signal SET is applied, the ground voltage is applied to the second node Qb and therefore data '1' is stored in the first node Q. As described above, when data is first input, data '0' (i.e., data to be programmed) is stored in the first node Q and, if it is determined that the threshold voltage has risen to the reference voltage and program has been completed, data '1' (i.e., program completion data) is stored in the first node Q.

That is, the data '1' stored in the first node Q functions as program-inhibited data or program completion data. In the case data '1' is input when data is first input, the corresponding data refers to program-inhibited data. On the contrary, when data '0' (i.e., data to be programmed) is input at the first input of data and is then changed to data '1', the data refers to program completion data.

It is determined whether, as a result of the verification, all cells to be programmed have been programmed at step 770. If, as a result of the determination, all the cells are determined not to have been programmed, a program voltage is increased by a step voltage, and a cycle of a program operation and a verification operation are repeatedly performed at step 780.

Data '1' is originally stored in program-inhibited cells. If it is determined that data '1' has been stored in the first nodes Q of all the page buffers, it is determined that a verification operation for the cells has been completed. However, if, as a result of the determination, all the cells are determined to have been programmed, the program operation is terminated.

As described above, in a verification operation, a precharge operation is not performed on a bit line connected to a program-inhibited cell, but the bit line remains in the ground state. Consequently, bit line coupling noise and the source line bouncing phenomenon can be minimized.

Figure 8:
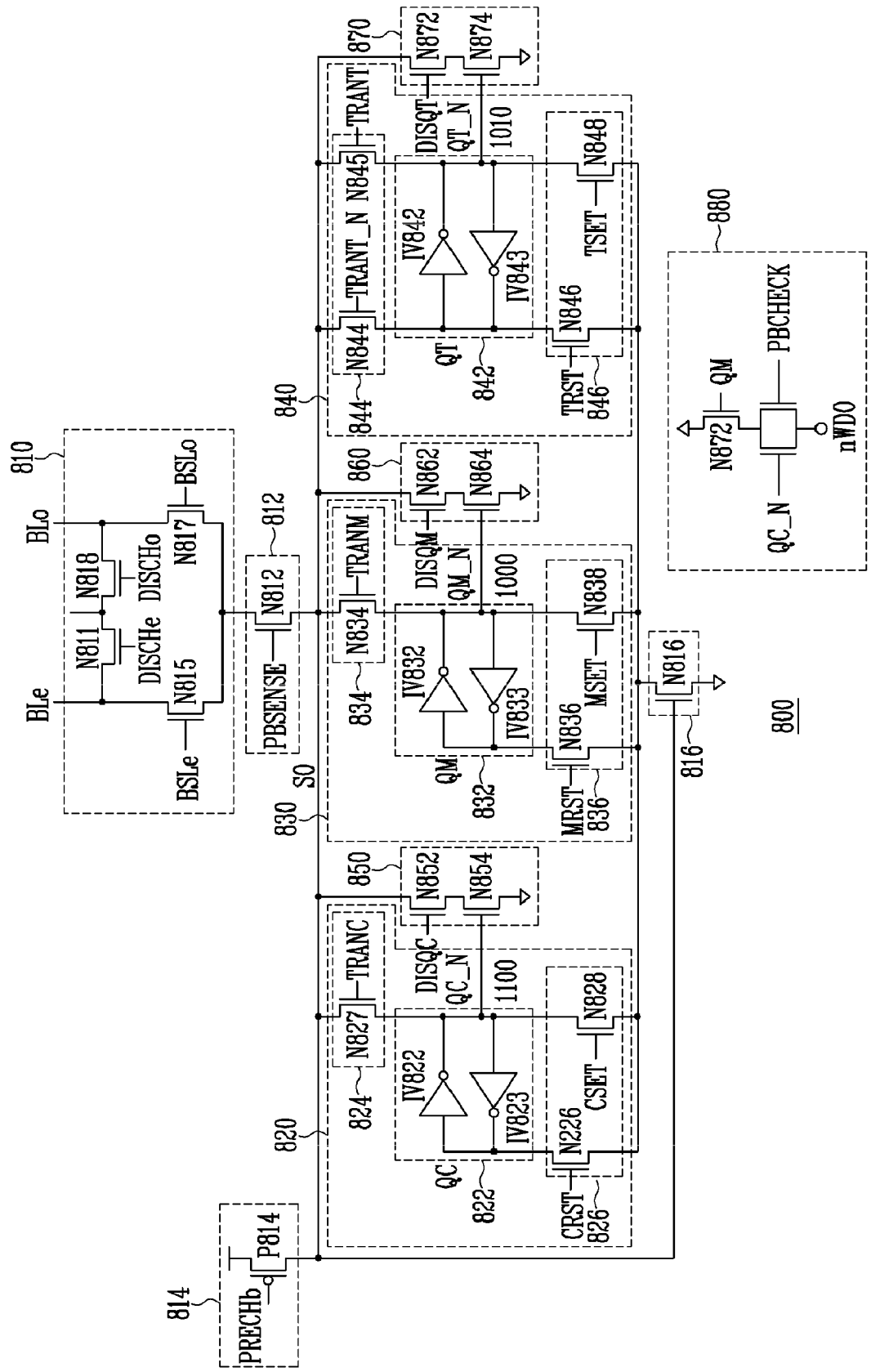
FIG. 8 is a circuit diagram showing the page buffer of a nonvolatile memory device according to another embodiment.

FIG. 8 is a circuit diagram showing the page buffer of a nonvolatile memory device according to another embodiment.

The page buffer 800 includes a bit line select unit 810, a bit line sensing unit 812, a sense node precharge unit 814, a sense node sensing unit 816, a first register 820, a second register 830, a third a register 840, and a pass/fail check unit 880.

For a detailed description of the construction of the bit line select unit 810, reference can be made to the description of the bit line select unit 630 shown in FIG. 6.

This embodiment is configured to include the bit line sensing unit 812 connected between the bit line select unit 810 and a sense node SO. The bit line sensing unit 812 is turned on in response to a bit line sense signal PBSENSE and is configured to include an NMOS transistor N812 connected between the bit line select unit 810 and the sense node SO. When verify/read operations are performed, sensing voltages (V1 and V2 in FIG. 7) are applied so that the state of a specific memory cell can be transferred to the sense node. In this construction, the NMOS transistors N815 and N817 of the bit line select unit 810 function to selectively connect bit lines and a bit line common node BLCM. A control signal (BSLe or BSLo) of a high-level or low-level signal is applied.

For a description of the sense node precharge unit 814 and the sense node sensing unit 816, reference can be made to the description of the sense node precharge unit 640 and the sense node sensing unit 670 shown in FIG. 6.

The first register 820 includes a latch unit 822, a data setting unit 826, a data transmission unit 824, and a first sense node discharge unit 850. The latch unit 822 is configured to store data. The data setting unit 826 is configured to transfer the ground voltage, transferred by the sense node sensing unit 816, to the latch unit 822 in response to data setting signals CRST and CSET. The data transmission unit 824 is configured to transfer data, stored in the first node QC_N of the latch unit 822, to the sense node SO. The first sense node discharge unit 850 is configured to selectively ground the sense node SO depending on data stored in the latch unit 822 and in response to a first sense node discharge signal DISQC.

The latch unit 822 includes a first inverter IV822 and a second inverter IV823. The output terminal of the first inverter IV822 is connected to the input terminal of the second inverter IV823, and the output terminal of the second inverter IV823 is connected to the input terminal of the first inverter IV822. A node between the output terminal of the first inverter IV822 and the input terminal of the second inverter IV823 is called a first node QC_N, and a node between the output terminal of the second inverter IV823 and the input terminal of the first inverter IV822 is called a second node QC. Accordingly, data having opposite levels is stored in the first node QC_N and the second node QC.

The data setting unit 826 includes an NMOS transistor N828 and an NMOS transistor N826. The NMOS transistor N828 is configured to apply the ground voltage, transferred by the sense node sensing unit 816, to the first node QC_N in response to the first data setting signal CSET. The NMOS transistor N826 is configured to apply the ground voltage, transferred by the sense node sensing unit 816, to the second node QC in response to the second data setting signal CRST.

The data transmission unit 824 includes an NMOS transistor N824 configured to transfer data, stored in the first node QC_N of the latch unit 822, to the sense node SO in response to a data transmission signal TRANC. Accordingly, when the data transmission signal TRANC is applied, data stored in the first node QC_N can be transferred to the sense node SO.

The first sense node discharge unit 850 selectively grounds the sense node SO depending on data stored in the latch unit 822 and in response to the first sense node discharge signal DISQC. According to one or more embodiments, when program-inhibited data or data, informing that program has been completed, is stored in the latch unit 822 of the first register and when the first sense node discharge signal DISQC is applied, the sense node SO is grounded.

To this end, the first sense node discharge unit 850 includes a first switching element N852 and a second switching element N854 which are connected in series between the sense node SO and a ground terminal. The first sense node discharge signal DISQC is applied to the gate of the first switching element N852, and the first switching element N852 is connected between the sense node SO and the second switching element N854. Data stored in the first node QC_N of the latch unit 822 is applied to the gate of the second switching element N854, and the second switching element N854 is connected between the ground terminal and the first switching element N852.

The second register 830 includes a latch unit 832, a data setting unit 836, a data transmission unit 834, and a second sense node discharge unit 860. The latch unit 832 is configured to store data. The data setting unit 836 is configured to transfer the ground voltage, transferred by the sense node sensing unit 816, to the latch unit 832 in response to data setting signals MRST and MSET. The data transmission unit 834 is configured to transfer data, stored in the first node QM_N of the latch unit 832, to the sense node SO. The second sense node discharge unit 860 is configured to selectively ground the sense node SO depending on data stored in the latch unit 832 and in response to a second sense node discharge signal DISQM.

The latch unit 832 includes a first inverter IV832 and a second inverter IV833. The output terminal of the first inverter IV832 is connected to the input terminal of the second inverter IV833, and the output terminal of the second inverter IV833 is connected to the input terminal of the first inverter IV832. A node between the output terminal of the first inverter IV832 and the input terminal of the second inverter IV833 is called a first node QM_N, and a node between the output terminal of the second inverter IV833 and the input terminal of the first inverter IV832 is called a second node QM. Accordingly, data having opposite levels is stored in the first node QM_N and the second node QM.

The data setting unit 836 includes an NMOS transistor N838 and an NMOS transistor N836. The NMOS transistor N838 is configured to apply the ground voltage, transferred by the sense node sensing unit 816, to the first node QM_N in response to the first data setting signal MSET. The NMOS transistor N836 is configured to apply the ground voltage, transferred by the sense node sensing unit 816, to the second node QM in response to the second data setting signal MRST.

The data transmission unit 834 includes an NMOS transistor N834 configured to transfer data, stored in the first node QM_N of the latch unit 832, to the sense node SO in response to a data transmission signal TRANM. Accordingly, when the data transmission signal TRANM is applied, data stored in the first node QM_N can be transferred to the sense node SO.

The second sense node discharge unit 860 selectively grounds the sense node SO depending on data stored in the latch unit 832 and in response to the second sense node discharge signal DISQM. According to one or more embodiments, when program-inhibited data is stored in the latch unit 832 of the second register and when the second sense node discharge signal DISQM is applied, the sense node SO is grounded.

To this end, the second sense node discharge unit 860 includes a first switching element N862 and a second switching element N864 which are connected in series between the sense node SO and a ground terminal. The second sense node discharge signal DISQM is applied to the gate of the first switching element N862, and the first switching element N862 is connected between the sense node SO and the second switching element N864. Data stored in the first node QM_N of the latch unit 832 is applied to the gate of the second switching element N864, and the second switching element N864 is connected between the ground terminal and the first switching element N862.

The third register 840 includes a latch unit 842, a data setting unit 846, a data transmission unit 844, and a third sense node discharge unit 870. The latch unit 842 is configured to store data. The data setting unit 846 is configured to transfer the ground voltage, transferred by the sense node sensing unit 816, to the latch unit 842 in response to data setting signals TRST and TSET. The data transmission unit 844 is configured to transfer data, stored in the first node QT_N of the latch unit 842, to the sense node SO. The third sense node discharge unit 870 is configured to selectively ground the sense node SO depending on data stored in the latch unit 842 and in response to a third sense node discharge signal DISQT.

The latch unit 842 includes a first inverter IV842 and a second inverter IV843. The output terminal of the first inverter IV842 is connected to the input terminal of the second inverter IV843, and the output terminal of the second inverter IV843 is connected to the input terminal of the first inverter IV842. A node between the output terminal of the first inverter IV842 and the input terminal of the second inverter IV843 is called a first node QT_N, and a node between the output terminal of the second inverter IV843 and the input terminal of the first inverter IV842 is called a second node QT. Accordingly, data having opposite levels is stored in the first node QT_N and the second node QT.

The data setting unit 846 includes an NMOS transistor N848 and an NMOS transistor N846. The NMOS transistor N848 is configured to apply the ground voltage, transferred by the sense node sensing unit 816, to the first node QT_N in response to the first data setting signal TSET. The NMOS transistor N846 is configured to apply the ground voltage, transferred by the sense node sensing unit 816, to the second node QT in response to the second data setting signal TRST.

The data transmission unit 844 includes an NMOS transistor N845 and an NMOS transistor N844. The NMOS transistor N845 is configured to transfer, data stored in the first node QT_N of the latch unit 842, to the sense node SO in response to a first data transmission signal TRANT. The NMOS transistor N844 is configured to transfer data, stored in the second node QT of the latch unit 842, to the sense node SO in response to a second data transmission signal TRANT_N. Accordingly, when each of the data transmission signals TRANT and TRANT_N is applied, data stored in each of the nodes QT and QT_N of the latch unit 842 can be transferred to the sense node SO.

The third sense node discharge unit 870 selectively grounds the sense node SO depending on data stored in the latch unit 842 and in response to the third sense node discharge signal DISQT. According to one or more embodiments, when program-inhibited data is stored in the latch unit 842 of the third register and when the third sense node discharge signal DISQT is applied, the sense node SO is grounded.

To this end, the third sense node discharge unit 870 includes a first switching element N872 and a second switching element N874 which are connected in series between the sense node SO and a ground terminal. The third sense node discharge signal DISQT is applied to the gate of the first switching element N872, and the first switching element N872 is connected between the sense node SO and the second switching element N874. Data stored in the first node QT_N of the latch unit 842 is applied to the gate of the second switching element N874, and the second switching element N874 is connected between the ground terminal and the first switching element N872.

The pass/fail check unit 880 checks whether a verification operation is fail or pass depending on data, stored in the first node QC_N of the latch unit 822 included in the first register 820, and data, stored in the second node QM of the latch unit 832 included in the second register 830, and in response to a verify check signal PBCHECK.

Even in a page buffer for a 2-bit MLC program operation, including the three registers in one page buffer as described above, the sense node discharge unit can be used to selectively precharge a bit line during a verification operation. Here, the construction of the sense node discharge unit may be changed depending on the purpose of operating the page buffer. For example, if it is sought to perform a program operation and a verification operation on the basis of only one of the three registers, a target operation can be performed using only one sense node discharge unit connected to the corresponding register. In a verification method to be later described, a bit line is selectively precharged using two sense node discharge units.

Figure 9:
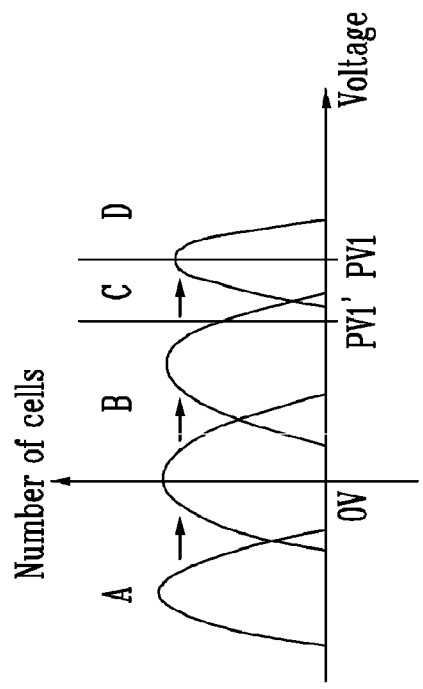
FIG. 9 is a diagram showing a verification method of the nonvolatile memory device according to another embodiment.
Figure 10:
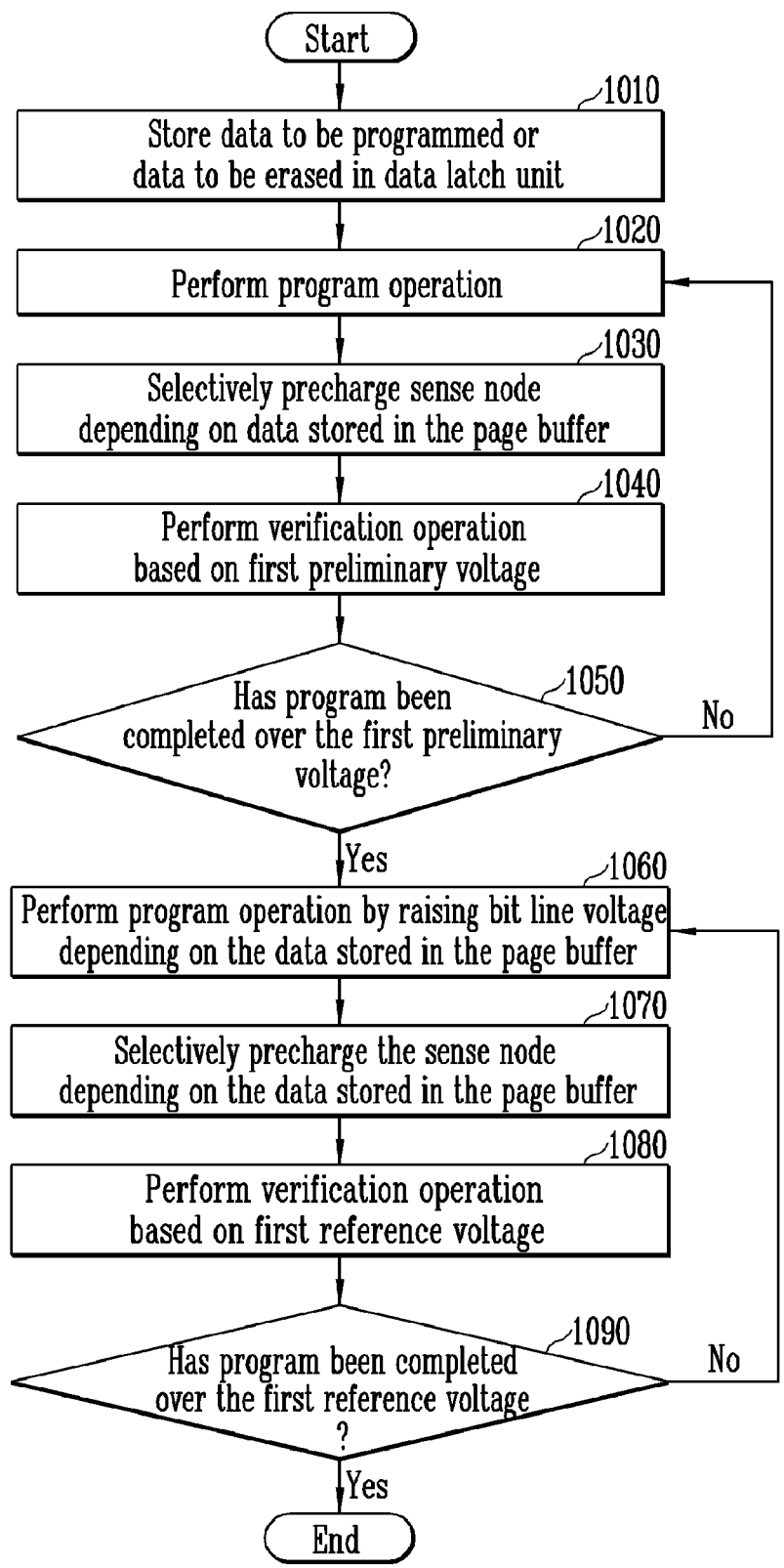
FIG. 10 is a diagram showing a verification method of the nonvolatile memory device according to yet another embodiment.

FIG. 9 is a diagram showing a verification method of the nonvolatile memory device according to another embodiment, and FIG. 10 is a diagram showing a verification method of the nonvolatile memory device according to yet another embodiment.

In the typical verification operation of a nonvolatile memory device, whether or not a threshold voltage is higher than a single reference voltage is determined. There is recently being used a double verification method using two reference voltages even in a program operation using a single state.

As shown in FIGS. 9 and 10, it is first assumed that a program operation is performed so that all threshold voltages have a first reference voltage PV1 or more. In typical cases, a verification operation is performed by applying the first reference voltage PV1 to a word line connected to a page including a cell to be verified. This method is the same as the method of applying the reference voltage (Vver), described with reference to FIG. 7A.

In the dual verification method, a verification operation is performed again by applying a first preliminary voltage PV1' slightly lower than the first reference voltage PV1. That is, a verification operation based on the first preliminary voltage PV1' is first performed, and a verification operation based on the first reference voltage PV1 is then performed.

In other words, the program operation is performed on a cell of an erase state, but the verification operation based on the first preliminary voltage PV1' is performed prior to the program operation. Here, the program operation is performed by maintaining the voltage of a bit line (the channel voltage of a cell) to 0 V until the voltage of the bit line reaches the first preliminary voltage PV1'.

The program operation is then performed on cells, programmed to have the first preliminary voltage PV1' or more, by slightly raising a bit line voltage until the cells are programmed to have the first reference voltage PV1 or more. Since there is no change in the value of a program voltage (Vpgm) applied to the floating gate of each of the cells, the difference between the program voltage and the bit line voltage reduces. Accordingly, there is an advantage in that a substantially reduced program voltage is applied. Consequently, the amount of a change in the threshold voltage by the program operation is slightly reduced. This operation is used to narrow the distribution of the threshold voltages of cells by reducing a change in the amount of threshold voltages of the cells whose threshold voltages have almost reached the first reference voltage PV1. In other words, with respect to cells programmed to have threshold voltages higher than the first preliminary voltage PV1', but lower than the first reference voltage PV1, a program operation is performed on the cells by slightly raising a bit line voltage and a verification operation is performed on the cells based on the first reference voltage PV1.

Next, if all the cells are programmed to have the first reference voltage PV1, a program operation is completed. This operation may also be applied to an MLC program operation. Since dual verification is performed in every state, it has only to perform a verification operation by setting a reference voltage and a preliminary voltage on a state-by-state basis even in an MLC program operation having several states. An example in which the dual verification operation is applied to one or more embodiments is described below.

First, data to be programmed or program-inhibited data is stored in each of the page buffers at step 1010. Referring to the registers of FIG. 8, in the case of a program-inhibited cell, data '1' is stored in each of the first nodes of the latch unit 832 of the second register and of the latch unit 842 of the third register. In the case of a cell to be programmed, data '0' is stored in each of the first nodes of the latch unit 832 of the second register and of the latch unit 842 of the third register.

In the dual verification operation, whether or not a cell has been programmed to have the first preliminary voltage PV1' or more (a higher voltage) or the first reference voltage PV1 is determined using at least two registers. According to one or more embodiments, data, indicating whether or not a cell has been programmed to have the first preliminary voltage PV1' or more, may be stored in the third register, and data, indicating whether or not a cell has been programmed to have the first reference voltage PV1 or more, may be stored in the second register.

Alternatively, data, indicating whether or not a cell has been programmed to have the first preliminary voltage PV1' or more (a higher voltage), may be stored in the first or second register other than the specific third register, and data, indicating whether or not a cell has been programmed to have the first reference voltage PV1 or more, may be stored in the first or third register other than the specific second register.

A program operation is then performed according to the input data at step 1020. For a detailed description of the program operation, reference can be made to the description of FIG. 5.

The sense node is selectively precharged depending on data stored in the page buffer at step 1030. Here, in the state where the connection between the sense node and the bit line is terminated, the sense node is precharged to a high level, but the sense node is selectively discharged depending on data stored in the data latch unit. That is, the sense node SO is precharged a high level by applying the sense node precharge signal Prechb of a low level. Next, the second sense node discharge signal DISQM and the third sense node discharge signal DISQT of a high level are then applied. Alternatively, only the third sense node discharge signal DISQT may be applied. Since data '1' is stored in the first node QT_N of the third register with respect to cells programmed to have the first preliminary voltage PV1' or more, the sense node may be grounded for the cells programmed to have the first preliminary voltage PV1' by applying only the third sense node discharge signal DISQT.

Consequently, the sense node is precharged to a high level with respect to only a page buffer in which data to be programmed has been stored.

In the case where data to be programmed is being stored in the latch unit of the page buffer, the sense node discharge units may not supply the ground voltages to the respective sense nodes despite the respective sense node discharge signals. However, when program-inhibited data or data, informing that a program has been completed, is stored in the latch units 832 and 842, the sense node discharge units supply the ground voltages to the respective sense nodes in response to the respective sense node discharge signals, so the sense nodes remains in a ground state. In particular, in cells programmed to have the first preliminary voltage PV1' or more, data '1' is stored in the latch unit 842 of the third register according to a verification operation to be described later. Accordingly, the sense node is discharged according to the operation of the third sense node discharge unit.

Next, a verification operation based on the first preliminary voltage is performed at step 1040.

To this end, in the state where the first preliminary voltage PV1' is applied to word lines including cells to be verified, the steps T2, T3, and T4 of FIG. 7A are performed.

Here, a latch unit whose data is changed in response to the voltage level of the sense node is specified as the latch unit 842 of the third register. In more detail, while data is being stored, the data setting signal TRST is applied so that data '1' is stored in the first node QT_N.

Consequently, in cells programmed to the first preliminary voltage PV1' or more, which belong to cells to be programmed, data '1' is stored in the first node QT_N of the latch unit 842 of the third register. Next, a program operation and a verification operation are repeatedly performed until the cells to be programmed are programmed to have the first preliminary voltage PV1' or more at step 1050. When data '1' is stored in the first node QT_N after the program has already been completed as described above, the sense node is grounded by the third sense node discharge unit 870 in the previous step 1030.

Next, if the cells to be programmed are programmed to have the first preliminary voltage PV1' or more, a program operation and a verification operation are repeatedly performed, but the verification operation based on the first reference voltage PV1 is performed.

In this case, the program operations are performed slightly differently. The program operations are performed by slightly raising a bit line voltage depending on data stored in the page buffer at step 1060.

That is, whether or not to raise the bit line voltage is determined depending on data stored in the latch unit 832 of the second register and the latch unit 842 of the third register. In the case where data '1' is stored in both the first nodes of the latch units, the bit line has been precharged to a high-level state VCC, so the bit line is no longer the subject of program. Furthermore, when data '0' is stored in both the first nodes of the latch units, the bit line has become a low-level state, so the bit line becomes the subject of program. However, when data '1' is stored in the first node QT_N of the latch unit of the third register and data '0' is stored in the first node QM_N of the latch unit of the second register because a cell has been programmed to have the first preliminary voltage or more, the voltage level of the bit line slightly rises. Consequently, the difference between a program voltage applied to the floating gate and voltage of the bit line (i.e., a channel voltage) is decreased by the amount of increment in the voltage level of the bit line. Accordingly, there is an advantage in that a program voltage is substantially decreased.

Prior to a verification operation based on the first reference voltage PV1 is performed, the sense node is selectively precharged depending on data stored in the page buffer at step 1070.

In the state that the connection between the sense node and the bit line is terminated, the sense node is precharged to a high level, but the sense node is selectively discharged depending on data stored in the data latch unit. That is, the sense node SO is precharged to a high level by applying the sense node precharge signal Prech b of a low level. The second sense node discharge signal DISQM of a high level is then applied. At this step, only the second sense node discharge signal DISQM is applied because whether or not verification has been completed is determined based on the data stored in the latch unit of the second register. Consequently, only for a page buffer storing data to be programmed, the sense node is precharged to a high level.

In the case where data to be programmed is stored in the latch unit 832 of the second register, the sense node discharge units may not apply the ground voltages to the respective sense nodes despite the application of the respective sense node discharge signals. However, when program-inhibited data or data, informing that a program has been completed, is stored in the latch unit 832, the sense node discharge unit applies the ground voltage to the sense node in response to the sense node discharge signal, so the sense node remains in the ground state. At this step, in cells programmed to have the first reference voltage PV1 or more, data '1' is stored in the latch unit 832 of the second register by a verification operation to be described later. Accordingly, the sense node is discharged by the operation of the second sense node discharge unit.

A verification operation is then performed on the basis of the first reference voltage PV1 at step 1080.

To this end, in the state where the first reference voltage PV1 is applied to a word line including a cell to be verified, the steps T2, T3, and T4 of FIG. 7A are performed.

Here, a latch unit whose data has been changed depending on the voltage level of the sense node is specified as the latch unit 832 of the second register. In more detail, while data is being stored, the data setting signal MRST is applied so that data '1' is stored in the first node QM_N.

Accordingly, in the case of some of the cells to be programmed, which have been programmed to have the first reference voltage PV1 or more, data '1' is stored in the first node QM_N of the latch unit 832 of the second register. Next, a cycle of a program operation and a verification operation are repeatedly performed until the cells to be programmed are programmed to have the first reference voltage PV1 or more at step 1090. In the case where data '1' is stored in the first node QM_N after program has already been completed as described above, the sense node is grounded by the second sense node discharge unit 860 in the previous step 1070.

If all the cells to be programmed are programmed to have the first reference voltage PV1 or more by this dual verification operation, it is determined that program has been completed.

Figure 11:
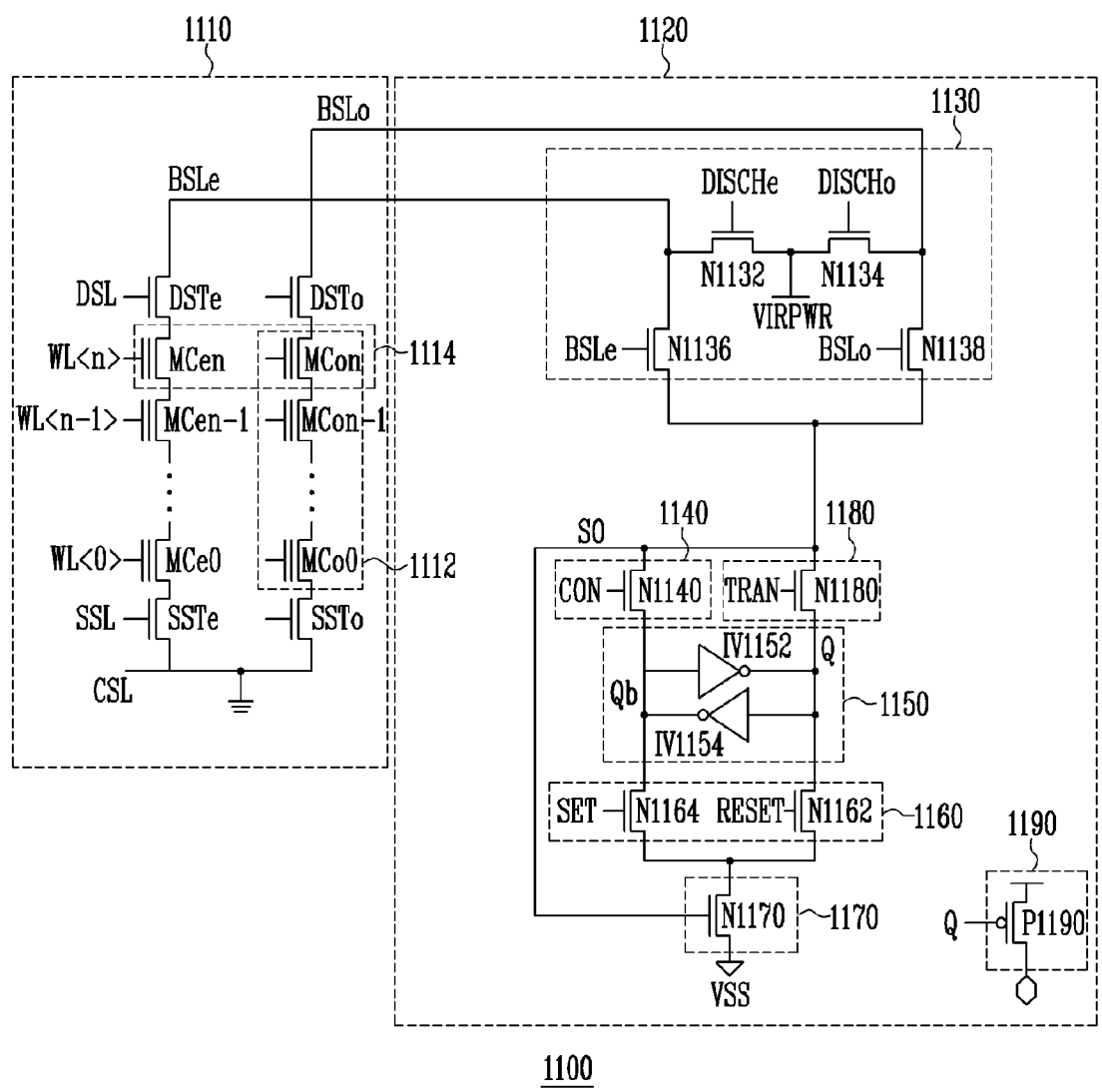
FIG. 11 is a circuit diagram of a nonvolatile memory device according to another embodiment.

FIG. 11 is a circuit diagram of a nonvolatile memory device according to another embodiment.

The nonvolatile memory device 1100 includes a construction capable of performing a verification operation only on cells to be programmed as in the nonvolatile memory device 600 of FIG. 6.

The nonvolatile memory device 1100 includes a memory cell array 1110 having memory cells and a page buffer 1120 connected to the memory cells and configured to program specific data into the memory cells or read data from the memory cells.

For a detailed construction of the memory cell array 1110, the description of FIG. 4 should be referred to the extent that the same description applies to both figures.

The page buffer 1120 includes a bit line select unit 1130 configured to selectively connect a bit line, connected to specific memory cells, to a sense node SO, a data latch unit 1150 configured to temporarily store data to be programmed into specific cells or to temporarily store data read from specific cells, a data setting unit 1160 configured to input data to be stored in the data latch unit, a sense node sensing unit 1170 configured to apply a ground voltage to a specific node of the data latch unit depending on the level of the sense node, a data transmission unit 1180 configured to apply data, stored in the data latch unit, to the sense node, and a verification signal output unit 1190 configured to inform whether verification has been completed based on data stored in the data latch unit 1150.

Constitution elements other than the sense node voltage setting unit 1140 correspond to the respective constitution elements of FIG. 6, and a description thereof is omitted. On the other hand, the page buffer 1120 does not include the sense node precharge unit 640 of FIG. 6.

The sense node voltage setting unit 1140 plays the role of the sense node precharge unit 640 and the sense node discharge unit 690 of FIG. 6. The sense node voltage setting unit 1140 is connected to the sense node SO and the second node Qb of the data latch unit 1150 and is configured to include an NMOS transistor N1140 turned on in response to a control signal CON.

In one or more embodiments, a sense node precharge operation is performed only on a cell to be programmed. Different data is stored in a first node Q depending on a program state. That is, in the case of a cell to be programmed, data '0' is stored in the first node Q. In the case of a program-inhibited cell, data '1' is stored in the first node Q. Meanwhile, the inverters IV1152 and IV1154 of the data latch unit 1150 each have a CMOS type and respectively include a PMOS transistor and an NMOS transistor which are connected in series between a power source terminal and a ground terminal. Here, the PMOS transistor functions as a pull-up element configured to supply a power supply voltage in response to a low-level signal, and the NMOS transistor functions as a pull-down element configured to supply a ground voltage in response to a high-level signal. Accordingly, when data '0' is stored in the first node Q, the data latch unit 1150 can supply the power supply voltage to the sense node SO. When data '1' is stored in the first node Q, the data latch unit 1150 can supply the ground voltage to the sense node SO.

That is, in the case of a cell to be programmed, the sense node is precharged to a high level. In the case of a program-inhibited cell, the sense node is precharged to a low level. As described above, the sense node voltage setting unit 1140 plays the role of the sense node discharge function and the sense node precharge function. Accordingly, the sense node precharge unit 640 and the sense node discharge unit 690 of FIG. 6 can be omitted.

In the prior art, a bit line connected to a program-inhibited cell is discharged in a high-level state, so a large amount of current is consumed. In one or more embodiments, there is almost no current consumption because a bit line connected to a program-inhibited cell remains in a discharge state. Furthermore, a cell whose threshold voltage has risen to a reference voltage though the repetitive program (e.g., to exceed the reference voltage or to be equal) and verification operations (i.e., a cell that has been programmed) also remains in a discharge state. Accordingly, current consumption can be inhibit because a ground state remains intact Consequently, coupling noise between bit lines and a source line bouncing phenomenon can be minimized.

What is claimed is:

1. A nonvolatile memory device, comprising:
 a data latch unit configured to store data to be programmed into a memory cell or store data read from a memory cell; and
 page buffers each comprising a sense node discharge unit configured to selectively ground, before a program verification operation of a program-inhibited memory cell, a sense node depending on data stored in the data latch unit and in response to a sense node discharge signal in order to prevent, during the program verification operation, precharging of a bit line of the program-inhibited cell through the sense node.

2. The nonvolatile memory device of claim 1, wherein:
 the sense node discharge unit comprises first and second switching elements connected in series between the sense node and a ground terminal,
 the first switching element is turned on in response to the sense node discharge signal, and
 the second switching element is turned on depending on the data stored in the data latch unit.

3. The nonvolatile memory device of claim 2, wherein:
the first switching element comprises an NMOS transistor having a gate to which the sense node discharge signal is input, and
the second switching element comprises an NMOS transistor having a gate connected to a first node of the data latch unit.

4. The nonvolatile memory device of claim 1, wherein the sense node discharge unit is configured to connect the sense node when program-inhibited data or program completion data is stored in the data latch unit and the sense node discharge signal is applied.

5. The nonvolatile memory device of claim 2, wherein the second switching element is turned on when program-inhibited data or program completion data is stored in the data latch unit.

6. The nonvolatile memory device of claim 1, wherein each of the page buffers comprises:
a sense node precharge unit configured to apply a power supply voltage having a high level to the sense node;
a data setting unit configured to input data to be stored in the data latch unit;
a sense node sensing unit configured to apply a ground voltage to a specific node of the data latch unit depending on a level of the sense node;
a data transmission unit configured to apply the data, stored in the data latch unit, to the sense node; and
a verification signal output unit configured to inform whether or not verification has been completed depending on the data stored in the data latch unit.

7. A nonvolatile memory device, comprising:
a first register configured to store data to be programmed into a memory cell or store data read from a memory cell; and
page buffers each comprising a first sense node discharge unit configured to selectively ground, before a program verification operation of a program-inhibited memory cell, a sense node depending on data stored in the first register and in response to a first sense node discharge signal in order to prevent, during the program verification operation, precharging of a bit line of the program-inhibited cell through the sense node.

8. The nonvolatile memory device of claim 7, wherein:
the first sense node discharge unit comprises first and second switching elements connected in series between the sense node and a ground terminal,
the first switching element is turned on in response to the first sense node discharge signal, and
the second switching element is turned on depending on the data stored in the first register.

9. The nonvolatile memory device of claim 7, wherein the page buffer further comprises:
a second register configured to store data to be programmed into a memory cell or store data read from a memory cell; and
a second sense node discharge unit configured to selectively ground a sense node depending on the data stored in the second register and in response to a second sense node discharge signal,
wherein the first register and the second register are connected in parallel to the same sense node.

10. The nonvolatile memory device of claim 9, wherein:
the first sense node discharge unit comprises first and second switching elements connected in series between the sense node and a ground terminal,
the first switching element is turned on in response to the first sense node discharge signal, and
the second switching element is turned on depending on the data stored in the first register.

11. The nonvolatile memory device of claim 9, wherein the page buffer further comprises:
a third register configured to store data to be programmed into a memory cell or store data read from a memory cell; and
a third sense node discharge unit configured to selectively ground a sense node depending on the data stored in the third register and in response to a third sense node discharge signal,
wherein the first register, the second register, and the third register are connected in parallel to the same sense node.

12. The nonvolatile memory device of claim 11, wherein:
the first sense node discharge unit comprises first and second switching elements connected in series between the sense node and a ground terminal,
the first switching element is turned on in response to the first sense node discharge signal, and
the second switching element is turned on depending on the data stored in the first register.

13. The nonvolatile memory device of claim 9, wherein:
the second sense node discharge unit comprises first and second switching elements connected in series between the sense node and a ground terminal,
the first switching element is turned on in response to the second sense node discharge signal, and
the second switching element is turned on depending on the data stored in the second register.

14. The nonvolatile memory device of claim 11, wherein:
the third sense node discharge unit comprises first and second switching elements connected in series between the sense node and a ground terminal,
the first switching element is turned on in response to the third sense node discharge signal, and
the second switching element is turned on depending on the data stored in the third register.

15. A method of operating a nonvolatile memory device comprising page buffers each comprising a sense node discharge unit configured to selectively ground a sense node depending on data stored in the page buffer and in response to a sense node discharge signal, the method comprising:
performing a program operation depending on the data stored in the page buffer;
selectively precharging a sense node, wherein the selective precharging of the sense node includes discharging a precharged sense node depending on the data stored in the page buffer;
selectively precharging a bit line by connecting the sense node and the bit line;
changing a voltage level of the bit line depending on a state of a cell;
sensing the voltage level of the bit line and storing the sensed voltage level of the bit line in the page buffer after the selective precharging of the sense node; and
performing a verification operation whether the program operation has been completed based on the stored data after the selective precharging of the sense node,
wherein when the sense node is connected to the bit line, the sense node is already discharged to prevent precharging of the bit line through the sense node.

16. The method of claim 15, wherein the program and the verification operation are repeated until cells to be programmed are programmed to have a reference voltage or more.

17. The method of claim 15, wherein the performance of the program operation depending on the data stored in the page buffer comprises:
when data '0' is stored in a first node of a data latch unit of the page buffer, performing the program operation; and
when data '1' is stored in the first node of the data latch unit of the page buffer, inhibiting the program operation.

18. The method of claim 15, wherein the selective precharging of the sense node depending on the data stored in the page buffer comprises:
precharging the sense node by operating the sense node precharge unit; and
discharging the sense node by operating the sense node discharge unit when program-inhibited data is stored in the page buffer.

19. The method of claim 15, wherein the selective precharging of the sense node depending on the data stored in the page buffer comprises:
precharging the sense node by operating the sense node precharge unit; and
discharging the sense node by operating the sense node discharge unit when a program completion data is stored in the page buffer,
wherein the program completion data is a cell to be programmed has been programmed to have a reference voltage or more.

20. The method of claim 15, wherein the selectively precharging the bit line connecting the sense node and the bit line comprises:
maintaining the bit line in a ground state when a program-inhibited data or a program completion data is stored in the page buffer,
wherein a cell to be programmed has been programmed to have a reference voltage or more, is stored in the page buffer.

21. The method of claim 15, wherein the sensing of the voltage level of the bit line and the storing of the sensed voltage level of the bit line in the page buffer comprises:
storing a program completion data in the page buffer when the voltage level of the bit line changes by a specific level or more depending on the change in the state of the cell to be verified,
wherein a cell to be programmed has been programmed to have a reference voltage or more.

22. A method of operating a nonvolatile memory device comprising a number of registers and page buffers, wherein each of the page buffers comprises a number of sense node discharge units configured to selectively ground a sense node depending on data stored in the respective registers and in response to a sense node discharge signal, the method comprising:
performing a program operation depending on the data stored in the page buffer;
selectively precharging the sense node depending on data stored in a first register of the page buffer;
selectively precharging a bit line by connecting the sense node and the bit line;
storing a program completion data in the first register when a cell is programmed to a first preliminary voltage or more by performing a verification operation;
performing a program operation depending on data stored in the page buffer when all cells to be programmed have been programmed to have the first preliminary voltage or more;
selectively precharging the sense node depending on data stored in a second register of the page buffer;
storing a program completion data in the second register when a cell is programmed to a first reference voltage or more by performing a verification operation; and
terminating the program operation.

23. The method of claim 22, wherein the performance of the program operation depending on the data stored in the page buffer comprises:
when data '0' is stored in the first register of the page buffer, performing the program operation; and
when data '1' is stored in the first and second registers of the page buffer, inhibiting the program operation.

24. The method of claim 22, wherein the selective precharging of the sense node depending on the data stored in the first register of the page buffer comprises:
precharging the sense node by operating a sense node precharge unit; and
discharging the sense node by operating a first sense node discharge unit when program-inhibited data or program completion data is stored in the first register of the page buffer.

25. The method of claim 22, wherein the performance of the program operation depending on the data stored in the page buffer when all the cells to be programmed have been programmed to have the first preliminary voltage or more comprises:
performing the program operation by applying a bit line voltage to a cell to be programmed,
wherein the bit line voltage is higher than 0 V and lower than a power supply voltage.

26. The method of claim 22, wherein the performance of the program operation depending on the data stored in the page buffer when all the cells to be programmed have been programmed to have the first preliminary voltage or more comprises:
when data '0' is stored in the second register of the page buffer, performing the program operation; and
when data '1' is stored in the first and second registers of the page buffer, inhibiting the program operation.

27. The method of claim 22, wherein the selective precharging of the sense node depending on the data stored in the second register of the page buffer comprises:
precharging the sense node by operating a sense node precharge unit; and
discharging the sense node by operating a second sense node discharge unit when program-inhibited data or program completion data is stored in the second register of the page buffer.

28. A method of operating a nonvolatile memory device comprising page buffers each comprising a sense node discharge unit configured to selectively ground a sense node depending on data stored in the page buffer and in response to a sense node discharge signal, the method comprising:
performing a program operation depending on the data stored in the page buffer;
selectively performing a verification operation depending on a stored data to be programmed; and
repeating the program and the verification operation until cells to be programmed are programmed to have a reference voltage or more,
wherein the selective grounding of the sense node is performed after the program operation but before the verification operation in order to prevent, during the verification operation, precharging of a bit line of a program-inhibited cell through the sense node.

29. The method of claim 28, wherein the selective performance of the verification operation depending on the a stored data to be programmed in the page buffer comprises:

selectively precharging the sense node depending on the data stored in the page buffer;

selectively precharging the bit line;

changing a voltage level of the bit line depending on a state of a cell to be verified; and sensing the voltage level of the bit line and storing the sensed voltage level of the bit line in the page buffer.

30. A nonvolatile memory device comprising page buffers, wherein each of the page buffers comprises:

a data latch unit configured to store data to be programmed into a memory cell or to store data read from a memory cell; and a sense node voltage setting unit configured to, before a program verification operation of a program-inhibited memory cell, selectively ground a sense node or supply a power supply voltage to the sense node depending on the data stored in the data latch unit in order to prevent, during the program verification operation, precharging of a bit line of the program-inhibited cell through the sense node.

31. The nonvolatile memory device of claim 30, further comprising a data transmission unit configured to selectively apply data, stored in a first node of the data latch unit, to the sense node.

32. The nonvolatile memory device of claim 30, wherein the sense node voltage setting unit comprises an NMOS transistor connected to a second node between the sense node and the data latch unit and configured to turn on in response to a control signal.

33. The nonvolatile memory device of claim 30, wherein the sense node voltage setting unit precharges the sense node to a high level when data to be programmed is stored in the data latch unit and discharges the sense node to a low level when program-inhibited data is stored in the data latch unit.

* * * * *